(12) United States Patent
Wu et al.

(10) Patent No.: US 11,270,963 B2
(45) Date of Patent: Mar. 8, 2022

(54) BONDING PADS INCLUDING INTERFACIAL ELECTROMIGRATION BARRIER LAYERS AND METHODS OF MAKING THE SAME

(71) Applicant: SANDISK TECHNOLOGIES LLC, Addison, TX (US)

(72) Inventors: Chen Wu, Leuven (BE); Peter Rabkin, Cupertino, CA (US); Masaaki Higashitani, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 15 days.

(21) Appl. No.: 16/742,213

(22) Filed: Jan. 14, 2020

(65) Prior Publication Data
US 2021/0217716 A1    Jul. 15, 2021

(51) Int. Cl.
*H01L 23/00* (2006.01)
*H01L 25/18* (2006.01)
(Continued)

(52) U.S. Cl.
CPC ............. *H01L 24/05* (2013.01); *H01L 24/03* (2013.01); *H01L 24/08* (2013.01); *H01L 24/89* (2013.01); *H01L 25/18* (2013.01); *H01L 25/50* (2013.01); *H01L 27/11526* (2013.01); *H01L 27/11556* (2013.01); *H01L 2224/0345* (2013.01); *H01L 2224/03452* (2013.01); *H01L 2224/03462* (2013.01); *H01L 2224/03614* (2013.01); *H01L 2224/03616* (2013.01); *H01L 2224/03622* (2013.01); *H01L 2224/0557* (2013.01);
(Continued)

(58) Field of Classification Search
CPC ..................... H01L 24/03; H01L 24/05; H01L 2224/02215; H01L 2224/02205; H01L 2224/05551; H01L 2224/05557; H01L 2224/05564; H01L 2224/05571; H01L 2224/05773; H01L 2224/05666; H01L 2224/5676; H01L 2224/05681; H01L 2224/05684; H01L 2224/80001
See application file for complete search history.

(56) References Cited

U.S. PATENT DOCUMENTS 5,915,167 A   6/1999 Leedy
6,144,099 A * 11/2000 Lopatin ................. H01L 21/288
                                                      257/751
(Continued)

OTHER PUBLICATIONS

U.S. Appl. No. 16/231,752, filed Dec. 24, 2018, SanDisk Technologies LLC.

(Continued)

*Primary Examiner* — David A Zarneke
(74) *Attorney, Agent, or Firm* — The Marbury Law Group PLLC

(57) ABSTRACT

A semiconductor die includes a first pad-level dielectric layer embedding first bonding pads and located over a first substrate. Each of the first bonding pads is located within a respective pad cavity in the first pad-level dielectric layer. Each of the first bonding pads includes a first metallic liner containing a first metallic liner material and contacting a sidewall of the respective pad cavity, a first metallic fill material portion embedded in the first metallic liner, and a metallic electromigration barrier layer contacting the first metallic fill material portion and adjoined to the first metallic liner.

20 Claims, 19 Drawing Sheets

(51) Int. Cl.
  *H01L 27/11556* (2017.01)
  *H01L 27/11526* (2017.01)
  *H01L 25/00* (2006.01)
(52) U.S. Cl.
  CPC .............. *H01L 2224/05557* (2013.01); *H01L 2224/05567* (2013.01); *H01L 2224/05583* (2013.01); *H01L 2224/05647* (2013.01); *H01L 2224/08147* (2013.01); *H01L 2224/80001* (2013.01); *H01L 2924/1431* (2013.01); *H01L 2924/14511* (2013.01)

(56) References Cited

U.S. PATENT DOCUMENTS

| | | | |
|---|---|---|---|
| 6,376,353 B1 * | 4/2002 | Zhou | H01L 21/7684 438/612 |
| 8,466,056 B2 | 6/2013 | Agarwala et al. | |
| 8,796,853 B2 * | 8/2014 | Yang | H01L 21/76882 257/751 |
| 8,872,341 B2 * | 10/2014 | Dallmann | H01L 23/53223 257/751 |
| 9,320,469 B2 * | 4/2016 | Shaw | A61B 5/153 |
| 9,953,941 B2 * | 4/2018 | Enquist | H01L 21/50 |
| 10,115,681 B1 | 10/2018 | Ariyoshi | |
| 10,283,493 B1 | 5/2019 | Nishida | |
| 10,354,980 B1 | 7/2019 | Mushiga et al. | |
| 10,354,987 B1 | 7/2019 | Mushiga et al. | |
| 10,381,322 B1 | 8/2019 | Azuma et al. | |
| 10,381,362 B1 | 8/2019 | Cui et al. | |
| 10,510,738 B2 | 12/2019 | Kim et al. | |
| 10,867,943 B2 * | 12/2020 | Chen | H01L 25/0657 |
| 2001/0033020 A1 | 10/2001 | Stierman et al. | |
| 2001/0035452 A1 | 11/2001 | Test et al. | |
| 2001/0050303 A1 | 12/2001 | Hartfield et al. | |
| 2003/0071319 A1 | 4/2003 | Stierman et al. | |
| 2003/0217462 A1 | 11/2003 | Wang et al. | |
| 2005/0106851 A1 | 5/2005 | Test et al. | |
| 2005/0116344 A1 | 6/2005 | Humpston | |
| 2005/0133899 A1 | 6/2005 | Haba et al. | |
| 2005/0218495 A1 | 10/2005 | Khandros et al. | |
| 2009/0200668 A1 * | 8/2009 | Yang | H01L 21/76883 257/751 |
| 2010/0044860 A1 | 2/2010 | Haba et al. | |
| 2010/0230795 A1 | 9/2010 | Kriman et al. | |
| 2011/0147928 A1 | 6/2011 | Haba et al. | |
| 2011/0147953 A1 | 6/2011 | Haba et al. | |
| 2011/0195273 A1 | 8/2011 | Chen et al. | |
| 2011/0285020 A1 | 11/2011 | Haba et al. | |
| 2012/0153426 A1 | 6/2012 | Oganesian et al. | |
| 2012/0153488 A1 | 6/2012 | Oganesian et al. | |
| 2013/0049196 A1 | 2/2013 | McElrea et al. | |
| 2013/0186944 A1 | 7/2013 | Haba et al. | |
| 2013/0341804 A1 | 12/2013 | Oganesian et al. | |
| 2014/0054766 A1 | 2/2014 | Hashino et al. | |
| 2014/0124565 A1 | 5/2014 | Haba et al. | |
| 2018/0366634 A1 * | 12/2018 | Mutus | H01L 24/10 |
| 2019/0221557 A1 | 7/2019 | Kim et al. | |
| 2019/0252361 A1 | 8/2019 | Nishida | |

OTHER PUBLICATIONS

U.S. Appl. No. 16/242,216, filed Jan. 8, 2019, SanDisk Technologies LLC.
U.S. Appl. No. 16/248,923, filed Jan. 16, 2019, SanDisk Technologies LLC.
U.S. Appl. No. 16/249,423, filed Jan. 16, 2019, SanDisk Technologies LLC.
U.S. Appl. No. 16/255,413, filed Jan. 23, 2019, SanDisk Technologies LLC.
U.S. Appl. No. 16/269,301, filed Feb. 6, 2019, SanDisk Technologies LLC.
U.S. Appl. No. 16/274,687, filed Feb. 13, 2019, SanDisk Technologies LLC.
U.S. Appl. No. 16/275,668, filed Feb. 14, 2019, SanDisk Technologies LLC.
U.S. Appl. No. 16/278,372, filed Feb. 18, 2019, SanDisk Technologies LLC.
U.S. Appl. No. 16/284,502, filed Feb. 25, 2019, SanDisk Technologies LLC.
U.S. Appl. No. 16/288,656, filed Feb. 28, 2019, SanDisk Technologies LLC.
U.S. Appl. No. 16/291,457, filed Mar. 4, 2019, SanDisk Technologies LLC.
U.S. Appl. No. 16/291,504, filed Mar. 4, 2019, SanDisk Technologies LLC.
U.S. Appl. No. 16/291,577, filed Mar. 4, 2019, SanDisk Technologies LLC.
U.S. Appl. No. 16/295,292, filed Mar. 7, 2019, SanDisk Technologies LLC.
U.S. Appl. No. 16/372,908, filed Apr. 2, 2019, SanDisk Technologies LLC.
U.S. Appl. No. 16/385,010, filed Apr. 16, 2019, SanDisk Technologies LLC.
U.S. Appl. No. 16/391,632, filed Apr. 23, 2019, SanDisk Technologies LLC.
U.S. Appl. No. 16/409,593, filed May 10, 2019, SanDisk Technologies LLC.
Endoh et al., "Novel Ultra High Density Memory with a Stacked-Surrounding Gate Transistor (S-SGT) Structured Cell," IEDM Proc. (2001) 33-36.
Banerjee, G. et al., "Chemical Mechanical Planarization Historical Review and Future Direction," ECS Transactions, vol. 13, No. 4, pp. 1-19 (2008).
U.S. Appl. No. 16/417,913, filed May 21, 2019, SanDisk Technologies LLC.
U.S. Appl. No. 16/440,183, filed Jun. 13, 2019, SanDisk Technologies LLC.
U.S. Appl. No. 16/521,849, filed Jul. 25, 2019, SanDisk Technologies LLC.
U.S. Appl. No. 16/523,029, filed Jul. 26, 2019, SanDisk Technologies LLC.
U.S. Appl. No. 16/552,089, filed Aug. 27, 2019, SanDisk Technologies LLC.
U.S. Appl. No. 16/589,404, filed Oct. 1, 2019, SanDisk Technologies LLC.
U.S. Appl. No. 16/660,177, filed Oct. 22, 2019, SanDisk Technologies LLC.
U.S. Appl. No. 16/666,522, filed Oct. 29, 2019, SanDisk Technologies LLC.
U.S. Appl. No. 16/671,025, filed Oct. 31, 2019, SanDisk Technologies LLC.
U.S. Appl. No. 16/682,848, filed Nov. 13, 2019, SanDisk Technologies LLC.
U.S. Appl. No. 16/694,340, filed Nov. 25, 2019, SanDisk Technologies LLC.
U.S. Appl. No. 16/694,400, filed Nov. 25, 2019, SanDisk Technologies LLC.
U.S. Appl. No. 16/694,438, filed Nov. 29, 2019, SanDisk Technologies LLC.
U.S. Appl. No. 16/728,327, filed Dec. 27, 2019, SanDisk Technologies LLC.
Notification of Transmittal of the International Search Report and Written Opinion of the International Search Authority for International Patent Application No. PCT/US2020/035612, dated Oct. 1, 2020, 9 pages.

* cited by examiner

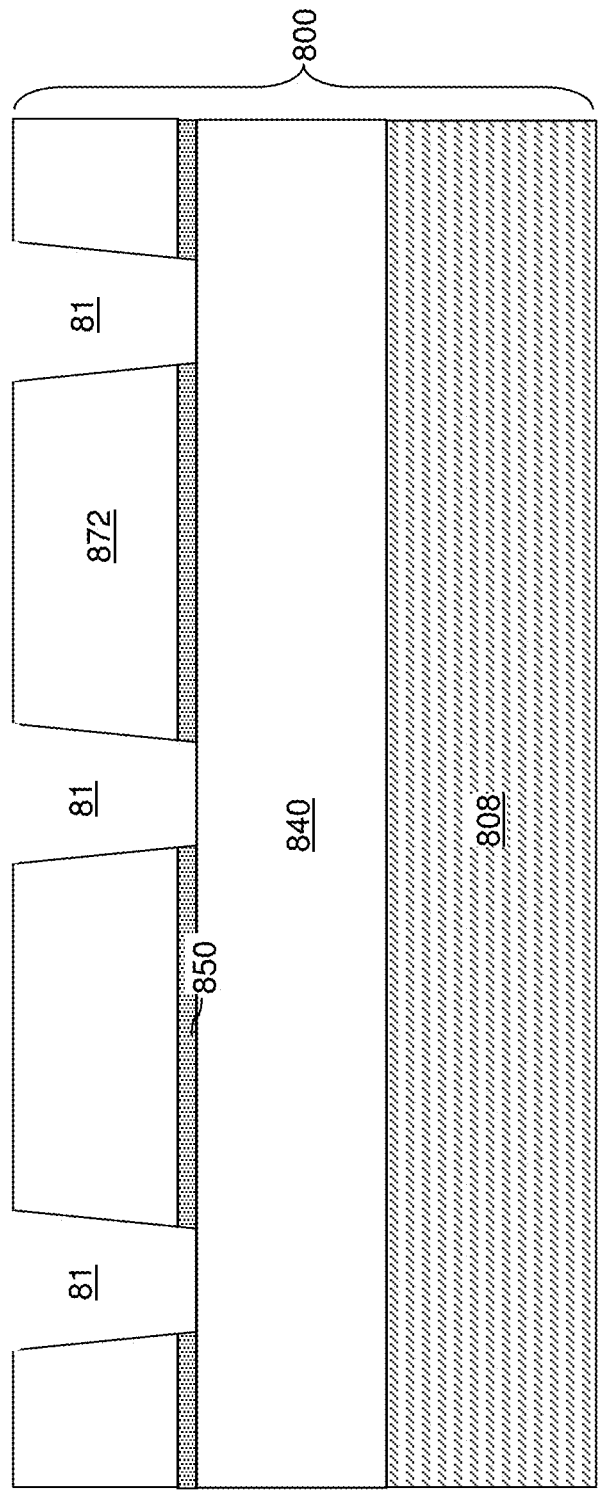

BONDING PADS INCLUDING INTERFACIAL ELECTROMIGRATION BARRIER LAYERS AND METHODS OF MAKING THE SAME

FIELD

The present disclosure relates generally to the field of semiconductor devices, and particularly to semiconductor structures including a semiconductor die with bonding pads containing an interfacial electromigration barrier layer and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell," IEDM Proc. (2001) 33-36.

SUMMARY

According to an aspect of the present disclosure, a structure comprising a first semiconductor die is provided. The first semiconductor die comprises: a first pad-level dielectric layer embedding first bonding pads and located over a first substrate, wherein each of the first bonding pads is located within a respective pad cavity in the first pad-level dielectric layer and comprises: a first metallic liner comprising a first metallic liner material and contacting a sidewall of the respective pad cavity; a first metallic fill material portion embedded in the first metallic liner; and a metallic electromigration barrier layer contacting the first metallic fill material portion and adjoined to the first metallic liner.

According to another aspect of the present disclosure, a method of forming a structure is provided. The method comprises: forming a first pad-level dielectric layer over a first substrate; forming pad cavities in the first pad-level dielectric layer; forming a first in-process bonding pad that includes a first metallic liner and a first metallic fill material portion within each pad cavity in the first pad-level dielectric layer; vertically recessing each of the first metallic fill material portions; and forming a metallic electromigration barrier layer on vertically recessed surfaces of each of the first metallic fill material portions, wherein first metal pads including a respective first metallic liner, a respective first metallic fill material portions, and a respective metallic electromigration barrier layer are formed.

BRIEF DESCRIPTION OF THE DRAWINGS

FIG. 1A is a schematic vertical cross-sectional view of a first semiconductor die after formation of a first via-level dielectric layer and via cavities according to an embodiment of the present disclosure.

DETAILED DESCRIPTION

Figure 1B:
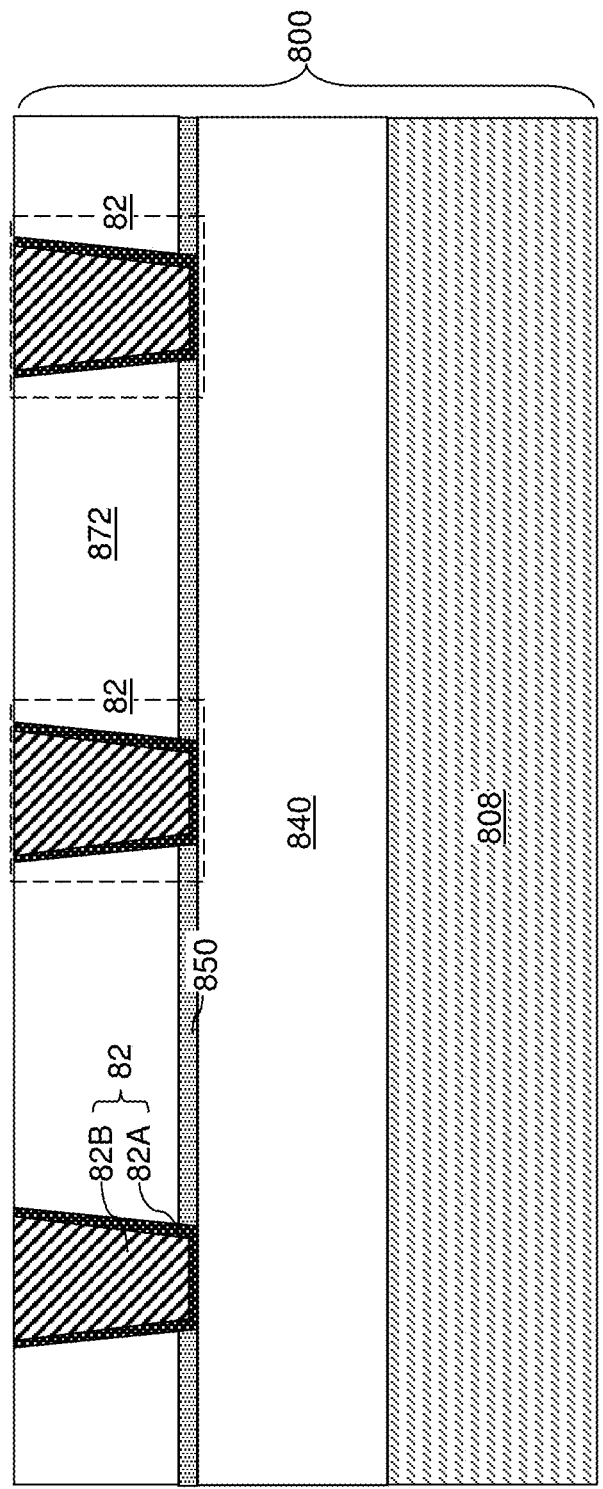
FIG. 1B is a schematic vertical cross-sectional view of the first semiconductor die after formation of first conductive via structures according to an embodiment of the present disclosure.

Bonding pads including copper are prone to recesses in regions proximal to metallic diffusion barrier layers, which can accelerate copper electromigration induced void formation. The embodiments of the present disclosure are directed to a semiconductor die with bonding pads containing a respective interfacial electromigration barrier layer and methods of manufacturing the same, the various aspects of which are described below. The electromigration barrier layer reduces or eliminates the copper electromigration induced void formation.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor package can include a memory chip containing one or more semiconductor dies. Thus, each semiconductor package contains one or more dies (for example one, two, or four). Plural dies may be formed on the same substrate following by dicing the substrate into separate dies. A memory die is the smallest unit that can independently execute commands or report status. Each memory die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed.

Referring to FIG. 1A, a first semiconductor die 800 according to an embodiment of the present disclosure is illustrated. The first semiconductor die 800 includes a first substrate 808 and a first device structure 840 formed over the first substrate 808. The first device structure 840 includes at least one first semiconductor device such as field effect transistors, a three-dimensional array of memory elements, or any other semiconductor device known in the art. The first device structure 840 may include at least one dielectric material layer at an upper portion thereof, and may include a plurality of electrically active nodes therein. The electrically active nodes of the first device structure 840 may, or may not, be arranged in a periodic pattern. In one embodiment, the first device structure 840 may include a control circuit for controlling a memory array provided in a second semiconductor die that can be bonded to the first semiconductor die 800. The first device structure 840 may have a planar top surface that is parallel to the top surface of the first substrate 808.

A first etch stop dielectric layer 850 can be optionally formed over the top surface of the first device structure 840. The first etch stop dielectric layer 850 includes an etch stop dielectric material having a higher etch resistivity than the dielectric material to be subsequently deposited over the first etch stop dielectric layer 850. For example, the first etch stop dielectric layer 850 includes silicon nitride or a dielectric metal oxide such as aluminum oxide. The thickness of the first etch stop dielectric layer 850 can be in a range from 5 nm to 30 nm, although lesser and greater thicknesses can also be employed.

A first via-level dielectric layer 872 can be deposited over the top surface of the first etch stop dielectric layer 850. The first via-level dielectric layer 872 includes a dielectric material such as undoped silicate glass (i.e., silicon oxide), a doped silicate glass, or organosilicate glass. The thickness of the first via-level dielectric layer 872 can be in a range from 100 nm to 600 nm, although lesser and greater thicknesses can also be employed.

First via cavities 81 can be formed through the first via-level dielectric layer 872. For example, a photoresist layer can be applied over the top surface of the first via-level dielectric layer 872, and can be lithographically patterned to form discrete openings that overlie the electrically active nodes within the first device structure 840. An anisotropic etch process can be performed to form the first via cavities 81 underneath the discrete openings in the patterned photoresist layer. The photoresist layer can be removed, for example, by ashing.

Referring to FIG. 1B, at least one conductive material can be subsequently deposited in the first via cavities 81. For example, a first continuous via-level metallic liner including a metallic nitride material such as TiN, TaN, or WN can be deposited by a conformal deposition process such as a chemical vapor deposition process. The thickness of the first continuous via-level metallic liner can be in a range from 3 nm to 30 nm, although lesser and greater thicknesses can also be employed. A first continuous via-level metallic seed layer can be optionally deposited by a non-conformal deposition process such as a physical vapor deposition process. The first continuous via-level metallic seed layer includes at least one metallic fill material such as Cu, Mo, Ru, Co, Al, another elemental metal, or an intermetallic alloy. The thickness of the first continuous via-level metallic seed layer on vertical or tapered surfaces can be in a range from 3 nm to 30 nm, although lesser and greater thicknesses can also be employed. A first continuous via-level metallic fill layer can be deposited by a conformal deposition process (such as a chemical vapor deposition process) or a superconformal deposition process (such as electroplating or electroless plating) to fill remaining volumes of the first via cavities 81. The first continuous via-level metallic fill layer can include Cu, CoW, CoWP, Mo, Ru, Co, Al, another elemental metal, or an intermetallic alloy. The material of the first continuous via-level metallic fill layer may be the same as, or different from, the material of the first continuous via-level metallic seed layer.

Excess portions of the at least one conductive material can be removed from above the horizontal plane including the top surface of the first via-level dielectric layer 872 by a planarization process. The planarization process can include a recess etch process and/or a chemical mechanical planarization process. Each remaining portion of the at least one conductive material comprises a conductive via structure, which is herein referred to as a first conductive via structure 82. The first conductive via structure 82 can include a via-level metallic liner 82A and a via-level metallic fill material portion 82B. The via-level metallic liner 82A is a remaining patterned portion of the first continuous via-level metallic liner. The via-level metallic fill material portion 82B is a combination of a remaining patterned portion of the first continuous via-level metallic seed layer and a remaining patterned portion of the first continuous via-level metallic fill layer. Thus, each first conductive via structure 82 includes a combination of a via-level metallic liner 82A and a via-level metallic fill material portion 82B.

Figure 1C:
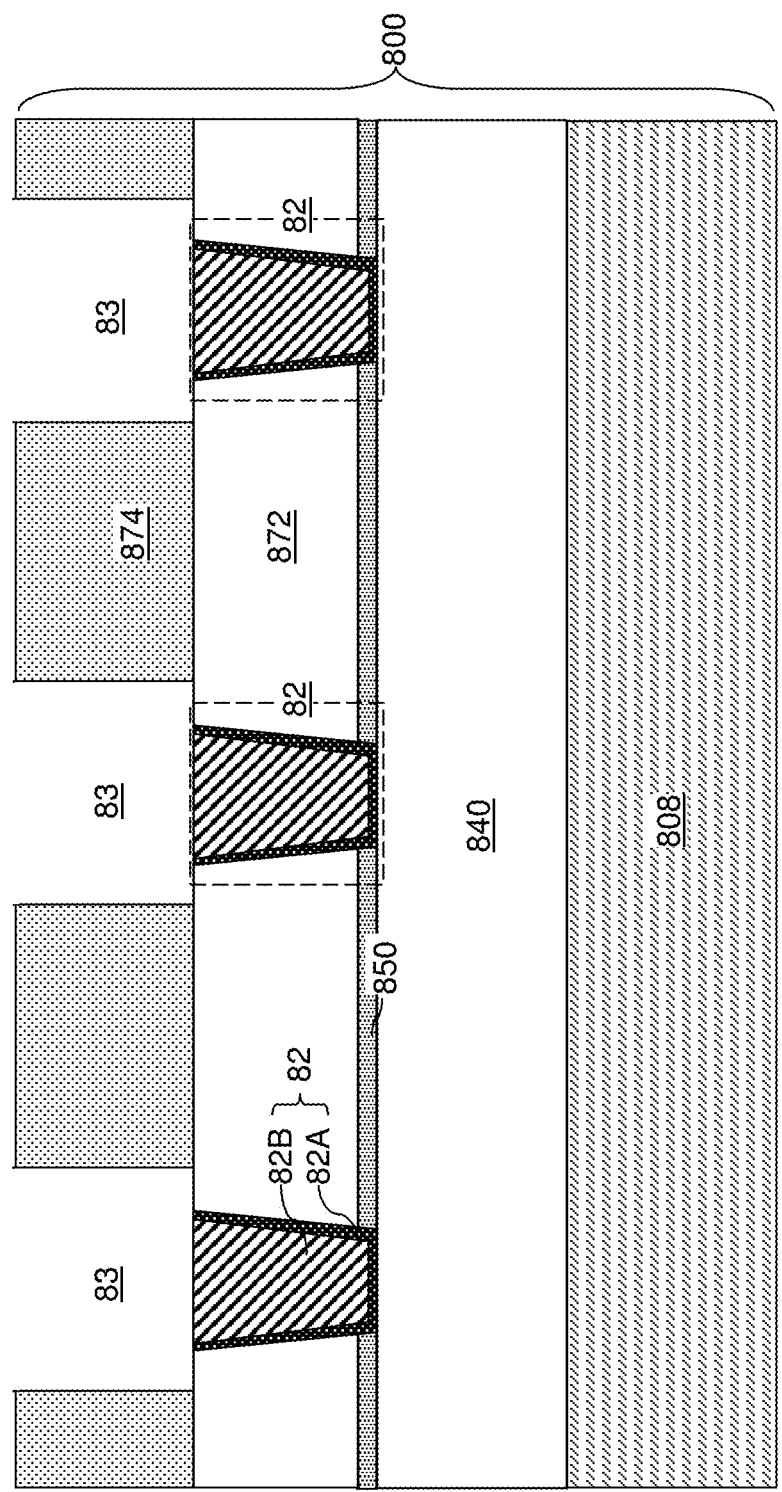
FIG. 1C is a schematic vertical cross-sectional view of the first semiconductor die after formation of a first pad-level dielectric layer and first openings therethrough according to an embodiment of the present disclosure.

Referring to FIG. 1C, a first pad-level dielectric layer 874 can be deposited over the first via-level dielectric layer 872. The first pad-level dielectric layer 874 includes a dielectric material such as undoped silicate glass (e.g., silicon oxide), or a doped silicate glass. The first pad-level dielectric layer 874 can be deposited by a conformal or a non-conformal deposition process. For example, the first pad-level dielectric layer 874 can be formed by a plasma-enhanced chemical vapor deposition process. The thickness of the first pad-level dielectric layer 874 can be in a range from 100 nm to 600 nm, although lesser and greater thicknesses can also be employed.

A photoresist layer (not shown) can be applied over the top surface of the first pad-level dielectric layer 874, and can be lithographically patterned to form pad-shaped openings overlying a respective one of the first conductive via structures 82. An anisotropic etch process can be performed employing the patterned photoresist layer as an etch mask layer. The pattern in the photoresist layer can be transferred through the first pad-level dielectric layer 874 by an anisotropic etch process to form first pad cavities 83. The first via-level dielectric layer 872 can be employed as an etch stop layer for the anisotropic etch process. A top surface of at least one first conductive via structure 82 can be physically exposed at the bottom of each first pad cavity 83. The maximum lateral dimension of each pad cavity 83 can be in a range from 2 microns to 100 microns, such as from 4 microns to 50 microns, although lesser and greater lateral dimensions can also be employed. Each first pad cavity 83 can have a horizontal cross-sectional shape of a polygon (such as a rectangle), a rounded polygon, a circle, an ellipse, or any other curvilinear two-dimensional shape having a closed periphery.

The sidewalls of the first pad cavities 83 can comprise surfaces of the material of the first pad-level dielectric layer 874. The sidewalls of the first pad cavities 83 can be vertical, or may have a taper angle that is less than 20 degrees relative to the vertical direction. For example, the taper angle may be in a range from 0.1 degree to 5 degrees. A top surface of the first via-level dielectric layer 872 and a top surface of a first conductive via structure 82 can be physically exposed at the bottom of each first pad cavity 83.

Figure 1D:
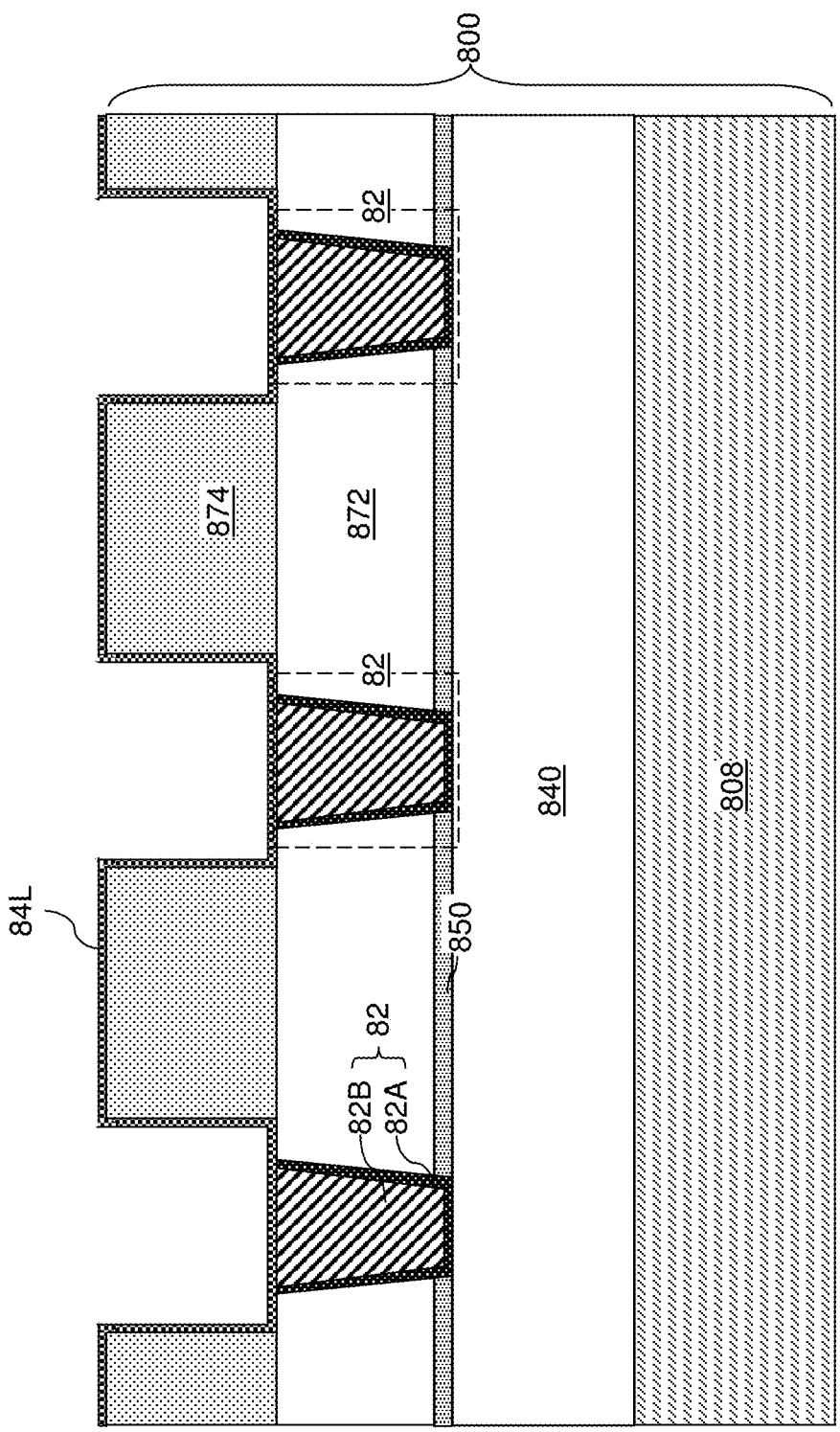
FIG. 1D is a schematic vertical cross-sectional view of the first semiconductor die after formation of a first continuous metallic liner according to an embodiment of the present disclosure.

Referring to FIG. 1D, a first continuous metallic liner 84L including a metallic nitride material such as TiN, TaN, or WN, and/or a barrier metal, such as tantalum, can be deposited by a conformal deposition process such as a chemical vapor deposition process. The first continuous metallic liner 84L can be deposited at peripheral regions of the first pad cavities 83 in the first pad-level dielectric layer 874. The thickness of the first continuous metallic liner 84L can be in a range from 3 nm to 30 nm, although lesser and greater thicknesses can also be employed.

Figure 1E:
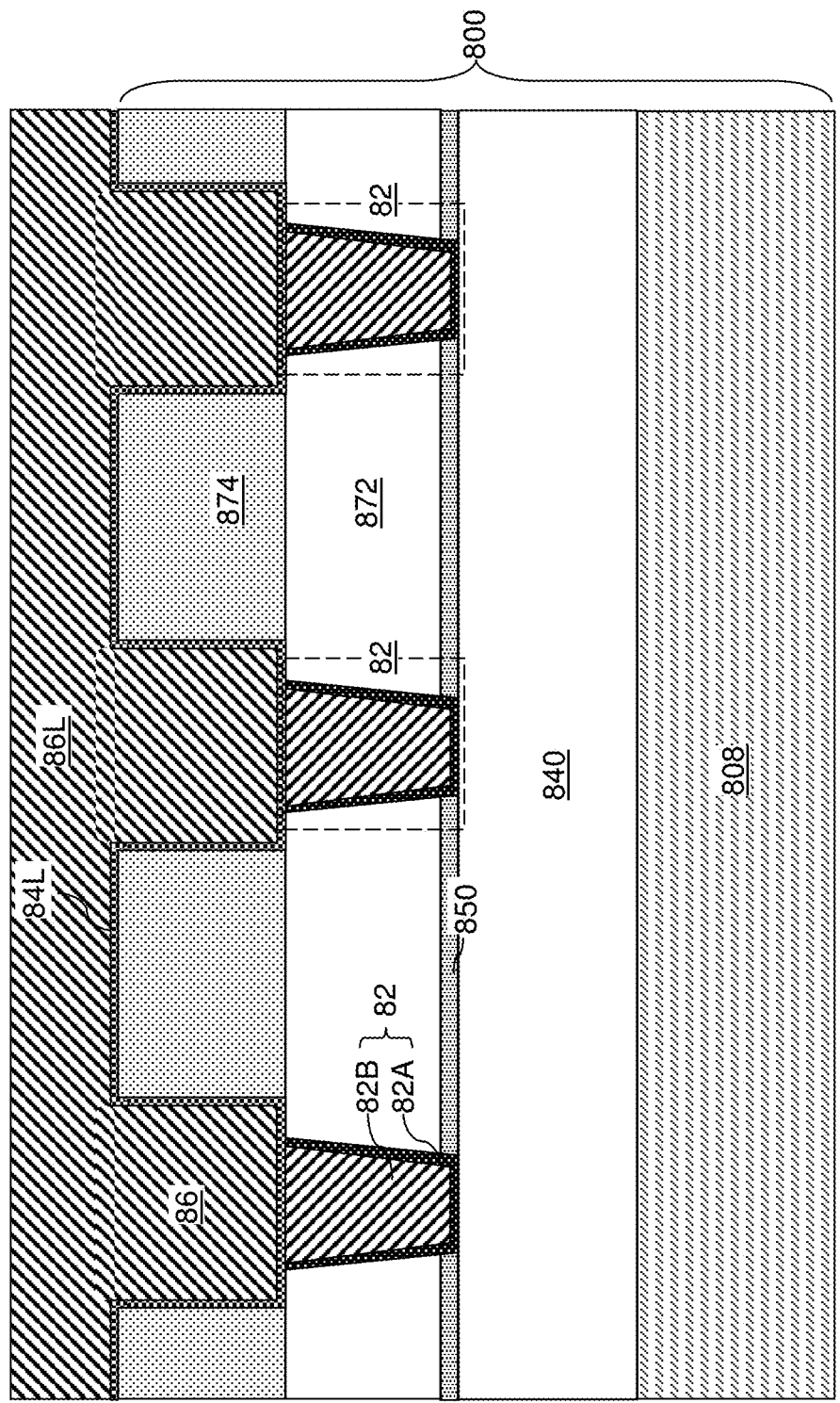
FIG. 1E is a schematic vertical cross-sectional view of the first semiconductor die after formation of a first continuous metallic fill material layer according to an embodiment of the present disclosure.

Referring to FIG. 1E, a first continuous metallic fill material layer 86L can be formed by depositing at least one metallic fill material into remaining volumes of the first pad cavities 83 and over the first continuous metallic liner 84L. The first continuous metallic fill material layer 86L can include a stack that includes, from bottom to top, a first continuous metallic seed layer and a first continuous metallic fill layer. In one embodiment, the first continuous metallic fill material layer 86L can comprise a first metallic fill material that includes copper or a copper alloy.

For example, the first continuous metallic seed layer can be optionally deposited by a non-conformal deposition process such as a physical vapor deposition process. The first continuous metallic seed layer includes at least one metallic fill material such as Cu, Mo, Ru, Co, Al, another elemental metal, or an intermetallic alloy. The thickness of the first continuous metallic seed layer on vertical or tapered surfaces can be in a range from 3 nm to 30 nm, although lesser and greater thicknesses can also be employed. The first continuous metallic seed layer can be formed directly on the first continuous metallic liner 84L.

The first continuous metallic fill layer can be deposited on the first continuous metallic seed layer by a conformal deposition process (such as a chemical vapor deposition process) or a superconformal deposition process (such as electroplating or electroless plating) to fill remaining volumes of the first pad cavities 83. In one embodiment, the first continuous metallic fill layer can be formed by electroplating a copper-containing material on the first continuous metallic seed layer. The first continuous metallic fill layer can include Cu, CoW, CoWP, Mo, Ru, Co, Al, another elemental metal, or an intermetallic alloy. The material of the first continuous metallic fill layer may be the same as, or different from, the material of the first continuous metallic seed layer. In one embodiment, the material of the first continuous metallic fill layer may consist essentially of copper or a copper alloy in which the atomic percentage of copper is at least 50%, and/or at least 70%, and/or at least 90%. The composition of the material of the first continuous metallic fill layer may be the same as, or may be different from, the composition of the material of the via-level metallic fill material portions 82B.

Figure 1F:
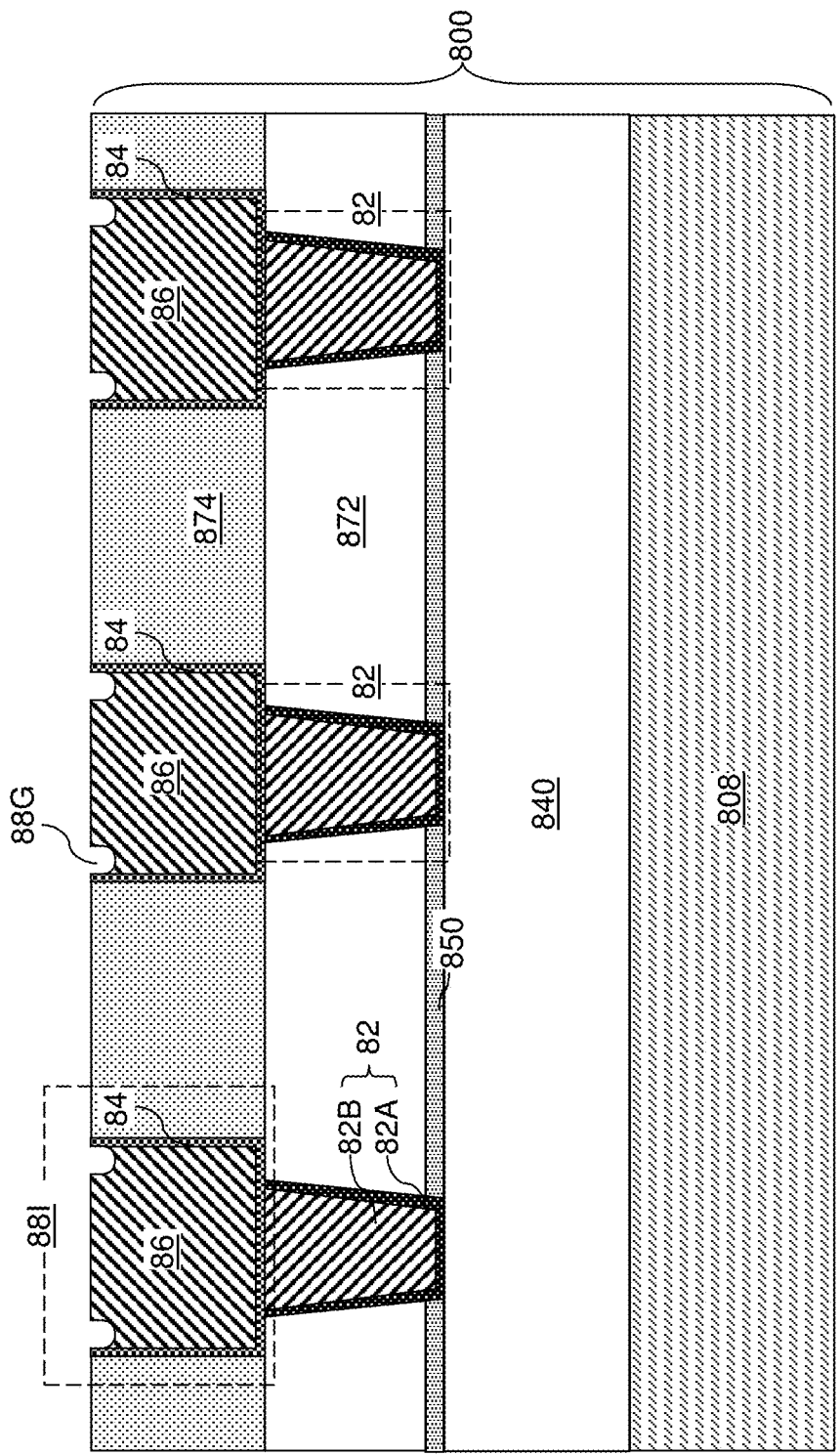
FIG. 1F is a schematic vertical cross-sectional view of the first semiconductor die after formation of first in-process bonding pads according to an embodiment of the present disclosure.

Referring to FIG. 1F, excess portions of the first continuous metallic fill material layer 86L and the first continuous metallic liner 84L can be removed from above the horizontal plane including the top surface (i.e., a horizontal distal surface) of the first pad-level dielectric layer 874 by a planarization process. The planarization process can include a chemical mechanical planarization process. Each remaining portion of the first continuous metallic fill material layer 86L constitutes a first metallic fill material portion 86. Each remaining portion of the first continuous metallic liner 84L constitutes a first metallic liner 84. Each combination of a first metallic fill material portion 86 and a first metallic liner 84 constitutes an in-process bonding pad, which is herein referred to as a first in-process bonding pad 881. In other words, each first in-process bonding pad 881 can include a first metallic liner 84 and a first metallic fill material portion 86. In one embodiment, each first metallic fill material portion 86 comprises a first metallic fill material that includes copper or a copper alloy.

Generally, a first in-process bonding pad 881 including a first metallic liner 84 and a first metallic fill material portion 86 can be formed within each pad cavity 83 in the first pad-level dielectric layer 874 by removing portions of the first continuous metallic fill material layer 86L and the first continuous metallic liner 84L from above the horizontal plane including the top surface of the first pad-level dielectric layer 874. Remaining contiguous material portions of the first continuous metallic fill material layer 86L and the first continuous metallic liner 84L comprise the first in-process bonding pads 881.

Presence of a metallic liner in proximity to a metallic fill material and/or galvanic corrosion during the CMP process may cause peripheral grooves 88G (i.e., edge recesses) at a periphery of a remaining portion of the metallic fill material 86 adjacent to the first metallic liner 84. For example, if copper filling a cavity lined with a first metallic liner material (such as TiN or TaN) is planarized employing a chemical mechanical planarization process, a remaining portion of copper has a peripheral groove 88G that adjoins remaining sidewalls of the first metallic liner material. Thus, grooves 88G can be formed at the periphery of each first metallic fill material portion 86 that remains after the planarization process. In one embodiment, one or more of the grooves 88G may have a configuration of a moat that extends around an entire periphery of a top surface of a respective first metallic fill material portion 86. The depth of each groove may be in a range from 2 nm to 50 nm, such as from 5 nm to 20 nm, and the width of each groove may be in a range from 1 nm to 50 nm, such as from 5 nm to 20 nm, although lesser and greater depths and/or widths can be formed depending on the process characteristics of the chemical mechanical planarization process.

Figure 1G:
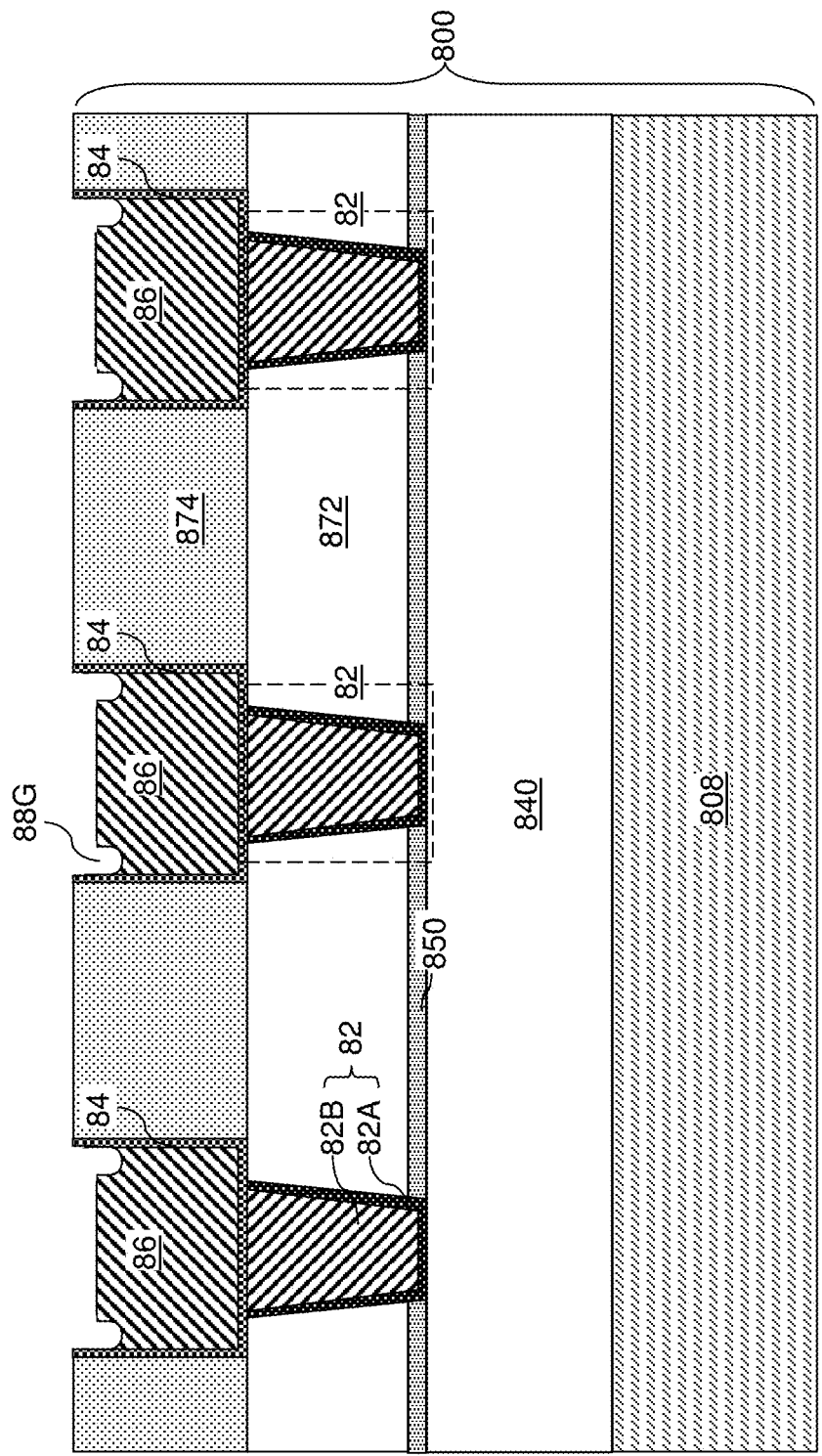
FIG. 1G is a schematic vertical cross-sectional view of the first semiconductor die after vertically recessing first metallic fill material portions according to an embodiment of the present disclosure.

Referring to FIG. 1G, the first metallic fill material portions 86 can be vertically recessed such that the top surfaces of the first metallic fill material portions 86 are located below the horizontal plane including the top surface of the first pad-level dielectric layer 874. In case the first metallic fill material portions 86 comprises, and/or consists essentially of, copper or a copper alloy, the first metallic fill material portions 86 can be isotropically etched by a wet etch process employing nitric acid, a saturated iron chloride solution including ions of $FeCl_3$, and/or a mixture of $NH_4OH$ and $H_2O_2$. Suitable dilution can be employed to provide a controlled etch rate. According to an aspect of the present disclosure, the vertical recess distance by which the vertically recessed surfaces of the first metallic fill material portions 86 are recessed relative to the horizontal plane including the top surface of the first pad-level dielectric layer 874 can be greater than the thickness of a first continuous metallic electromigration barrier layer to be subsequently deposited. In one embodiment, the dilution of the etchant and the duration of the etch process can be selected such that the vertical recess distance for the top surfaces of the first metallic fill material portions 86 can be in a range from 5 nm to 100 nm, such as from 10 nm to 50 nm.

Figure 1H:
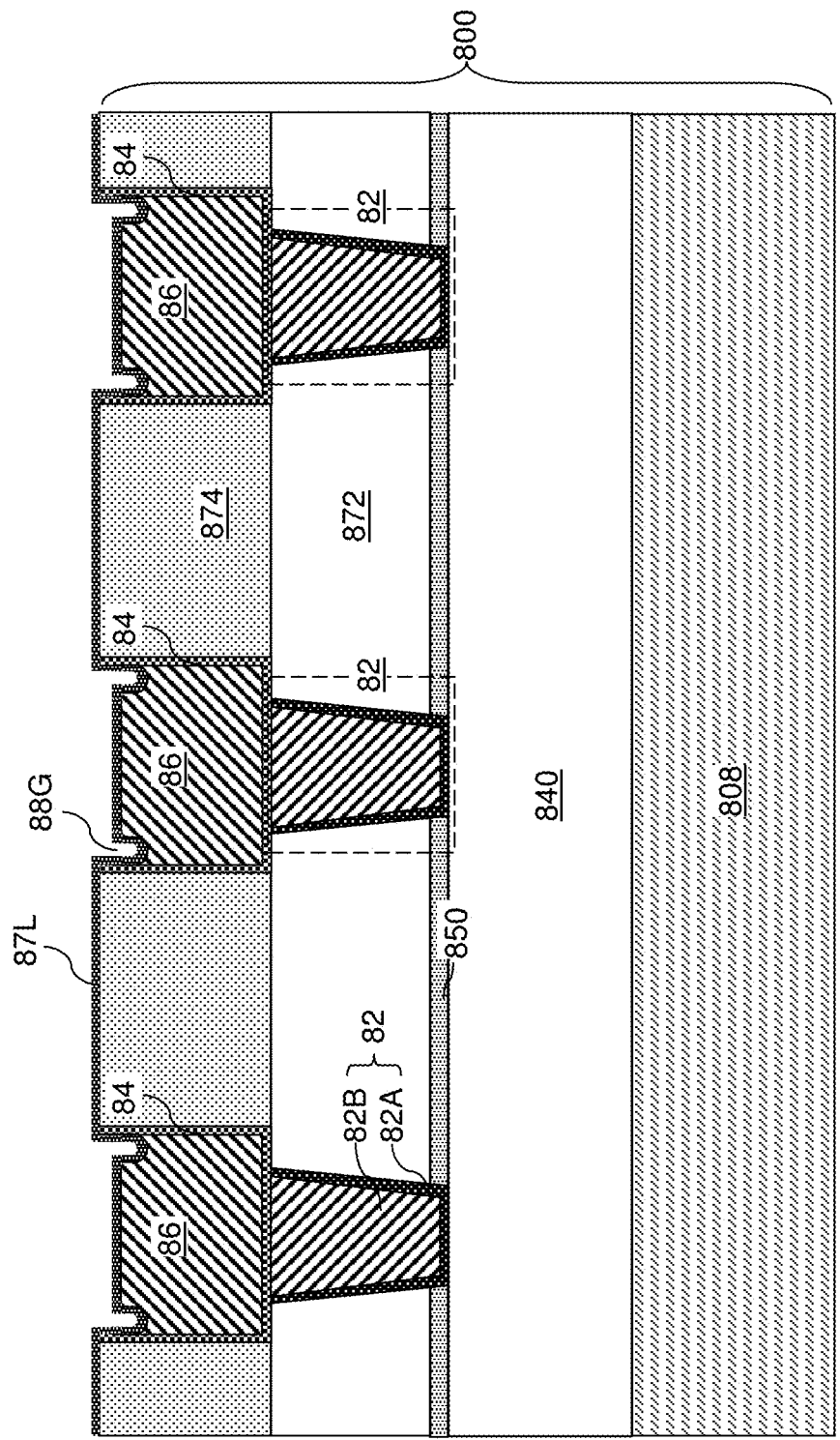
FIG. 1H is a schematic vertical cross-sectional view of the first semiconductor die after formation of a first continuous metallic electromigration barrier layer according to an embodiment of the present disclosure.

Referring to FIG. 1H, a first continuous metallic electromigration barrier layer 87L can be deposited on the vertically recessed surfaces of the first metallic fill material portions 86 and on the physically exposed surfaces of the first metallic liners 84 and the first pad-level dielectric layer 874. The first continuous metallic electromigration barrier layer 87L includes a metallic electromigration barrier material, i.e., an electromigration-resistant metallic material, that has a greater electrical resistivity than the first metallic fill material of the first metallic fill material portions 86. Metallic electromigration barrier materials that may be employed for the first continuous metallic electromigration barrier layer 87L include, but are not limited to, TaN, TiN, WN, Ta, Ti, W, Ru, or alloys thereof. In one embodiment, the first continuous metallic electromigration barrier layer 87L can include, and/or can consist essentially of, TaN. In another embodiment, the first continuous metallic electromigration barrier layer 87L can include, and/or can consist essentially of, Ru.

The thickness of the first continuous metallic electromigration barrier layer 87L can be in a range from 3 nm to 30 nm, such as from 5 nm to 10 nm. As discussed above, the a vertical recess distance by which the vertically recessed surfaces of the first metallic fill material portions 86 are recessed relative to the horizontal plane including the top surface of the first pad-level dielectric layer 874 is greater than the thickness of the first continuous metallic electromigration barrier layer 87L. Thus, the top surface of each portion of the first continuous metallic electromigration barrier layer 87L that overlies a first metallic fill material portion 86 is vertically recessed below the horizontal plane including the top surface of the first pad-level dielectric layer 874. The first continuous metallic electromigration barrier layer 87L conformally covers the physically exposed surfaces of the first metallic fill material portions 86 including the surfaces of each groove 88G at peripheral regions of the first metallic fill material portions 86. The first continuous metallic electromigration barrier layer 87L can include contoured portions that protrude downward into a respective one of the grooves 88G at the peripheral regions of the first metallic fill material portions 86.

Figure 1I:
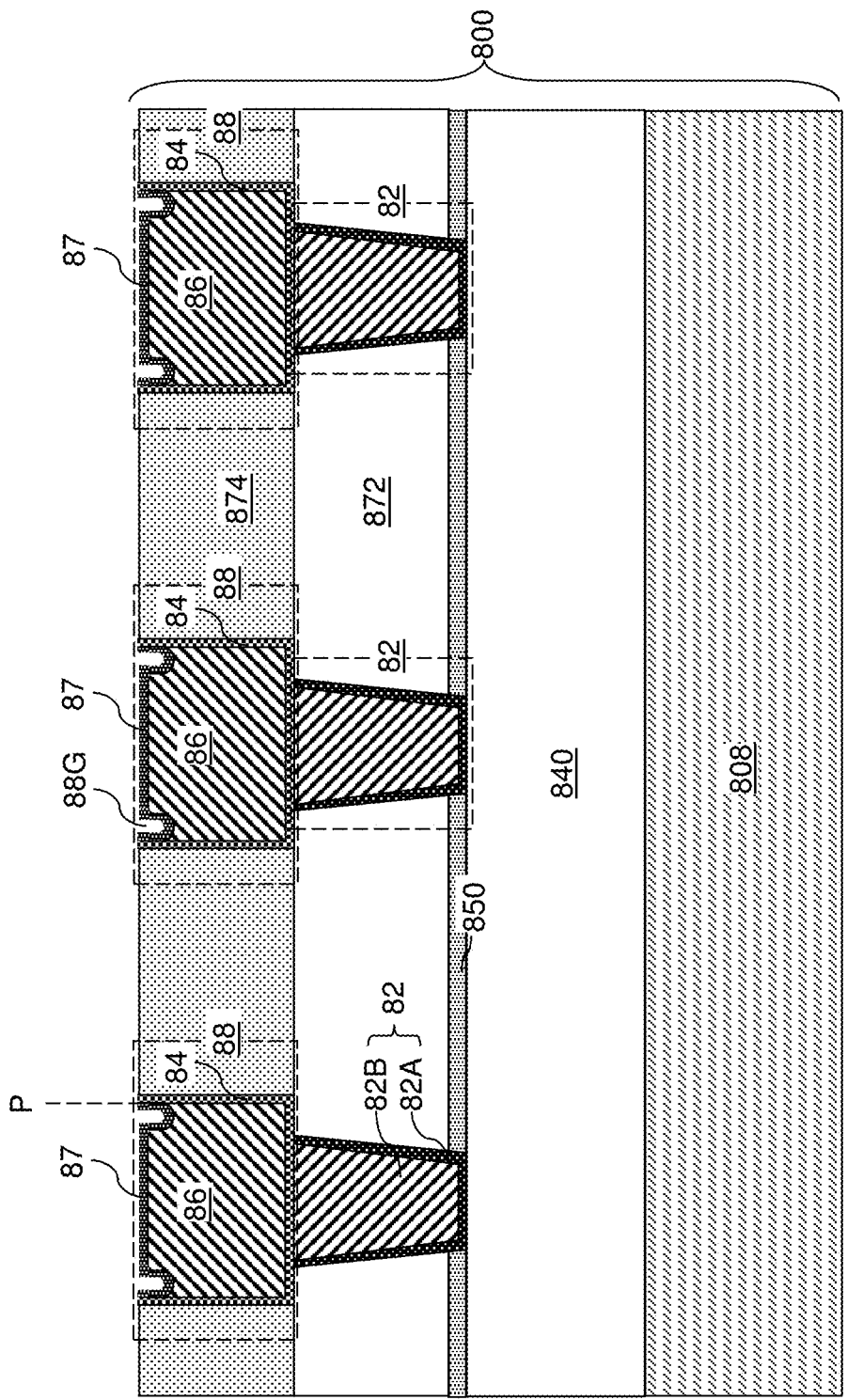
FIG. 1I is a schematic vertical cross-sectional view of the first semiconductor die after formation of first bonding pads according to an embodiment of the present disclosure.

Referring to FIG. 1I, portions of the first continuous metallic electromigration barrier layer 87L can be removed from outside the first pad cavities 83 by a planarization process employing chemical mechanical planarization (CMP). Topmost portions of the first pad-level dielectric layer 874 can be removed from above the horizontal plane including distal horizontal surfaces of horizontally-extending portions of the first continuous metallic electromigration barrier layer 87L that overlie the vertically recessed surfaces of the first metallic fill material portions 86. The horizontally-extending portions of the first continuous metallic electromigration barrier layer 87L overlying the first metallic fill material portions 86 can be employed as stopping surfaces during the planarization process. Remaining portions of the first continuous metallic electromigration barrier layer 87L after the planarization process comprise metallic electromigration barrier layers 87. Each contiguous combination of the first metallic liner 84, the first metallic fill material portion 86 and the metallic electromigration barrier layer 87 constitutes a first bonding pad 88.

The first semiconductor die 800 comprises a first pad-level dielectric layer 874 embedding first bonding pads 88 located over a first substrate 808. Each of the first bonding pads 88 is located within a respective pad cavity 83 in the first pad-level dielectric layer 874. Each of the first bonding pads 88 comprises a first metallic liner 84 comprising a first metallic liner material and contacting a sidewall of the respective pad cavity 83, a first metallic fill material portion 86 embedded in the first metallic liner 84, and a metallic electromigration barrier layer 87 contacting the first metallic fill material portion 86 and adjoined to the first metallic liner 84. In one embodiment, a combination of the metallic electromigration barrier layer 87 and the first metallic liner 84 encapsulates the first metallic fill material portion 86. In other words, the entirety of the first metallic fill material portion 86 can be located within a volume defined by surfaces of the combination of the metallic electromigration barrier layer 87 and the first metallic liner 84 such that the surfaces of the combination do not include any hole therethrough. In one embodiment, a distal surface (i.e., a surface that is distal from the first substrate 808) of the first pad-level dielectric layer 874 is located within a same horizontal plane as a distal surface of the metallic electromigration barrier layer 87, which is the horizontal plane of planarization of the planarization process.

In one embodiment, the first metallic liner 84 comprises an inner sidewall. A distal region of the inner sidewall contacts the metallic electromigration barrier layer 87 at a first interface, and a proximal region of the inner sidewall contacts the first metallic fill material portion 86 at a second interface located within a same two-dimensional plane P as the first interface. In one embodiment, the second interface is vertically offset from a horizontal plane including a distal horizontal surface of the metallic electromigration barrier layer 87 by a vertical spacing that is greater than the thickness of the metallic electromigration barrier layer 87.

In one embodiment, the contact area between the first metallic liner 84 and the metallic electromigration barrier layer 87 has an upper edge located within a horizontal plane including a distal surface of the first pad-level dielectric layer 874. In one embodiment, a peripheral region of the first metallic fill material portion 86 below the groove 88G is vertically recessed from the horizontal plane including the distal surface of the first pad-level dielectric layer 874 by a vertical recess distance that is greater than the thickness of the metallic electromigration barrier layer 87. In one embodiment, the vertical recess distance in a range from 7 nm to 50 nm, such as from 15 nm to 30 nm, although lesser and greater vertical recess distances can also be employed. The entirety of a recessed peripheral portion of each first metallic fill material portion 86 can be covered by a downward-protruding peripheral portion of a metallic electromigration barrier layer 87.

In one embodiment, the first metallic fill material portion 86 comprises a first metallic fill material that includes copper or a copper alloy, and the metallic electromigration barrier layer 87 comprises an electrically conductive metallic electromigration barrier material that acts as a copper diffusion barrier. In one embodiment, the metallic electromigration barrier material comprises at least one material selected from TaN, TiN, WN, Ta, Ti, W, Ru, or alloys thereof. In one embodiment, metallic electromigration barrier layer 87 is laterally spaced from the first pad-level dielectric layer 874 by the first metallic liner 84.

Figure 2A:
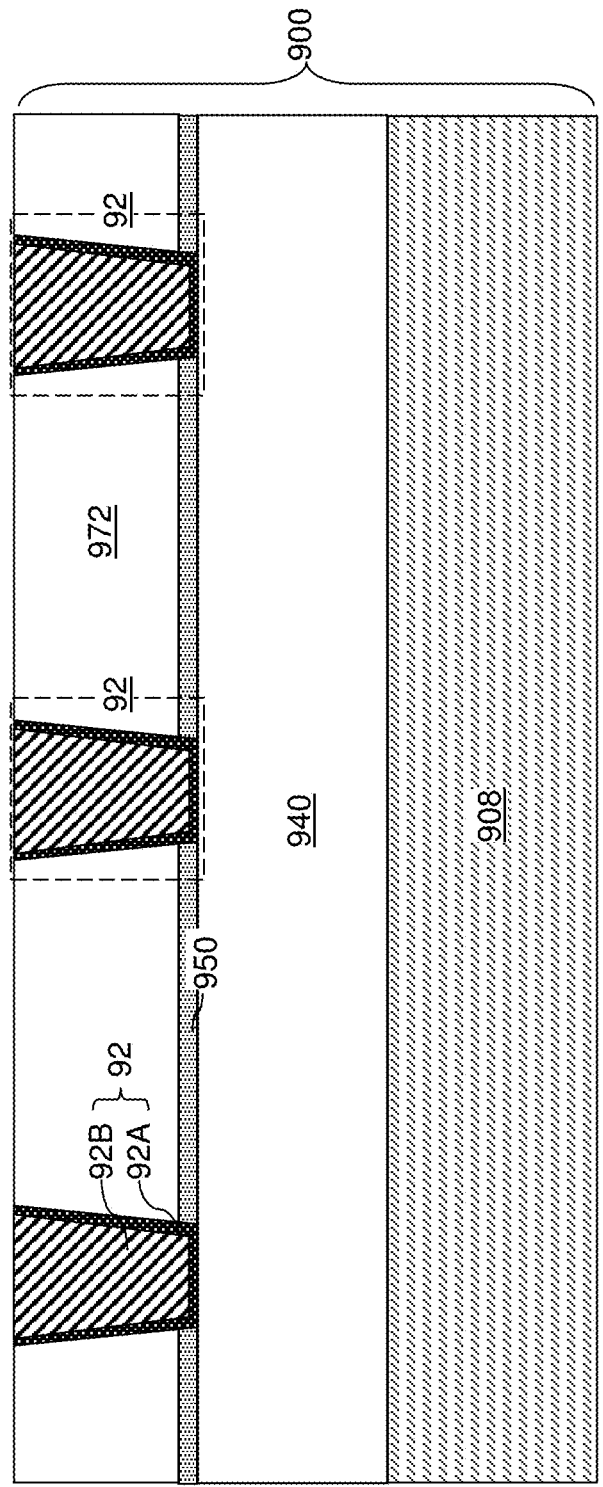
FIG. 2A is a schematic vertical cross-sectional view of a second semiconductor die after formation of a second via-level dielectric layer and second conductive via structures according to an embodiment of the present disclosure.

Referring to FIG. 2A, a second semiconductor die 900 according to an embodiment of the present disclosure is illustrated. The second semiconductor die 900 includes a second substrate 908 and a second device structure 940 formed over the second substrate 908. The second device structure 940 includes at least one second semiconductor device such as field effect transistors, a three-dimensional array of memory elements, or any other semiconductor device known in the art. The second device structure 940 may include at least one dielectric material layer at an upper portion thereof, and may include a plurality of electrically active nodes therein. The electrically active nodes of the second device structure 940 may, or may not, be arranged in a periodic pattern. In one embodiment, the second device structure 940 may include a three-dimensional memory device such as a three-dimensional array of memory elements in which memory elements are vertically stacked. In such cases, the electrically active nodes within the second device structure 940 can include drain regions connected to a top end of a respective vertical semiconductor channel in a respective memory stack structure. The second device structure 940 may have a planar top surface that is parallel to the top surface of the second substrate 908.

A second etch stop dielectric layer 950 can be optionally formed over the top surface of the second device structure 940. The second etch stop dielectric layer 950 includes an etch stop dielectric material having a higher etch resistivity than the dielectric material to be subsequently deposited over the second etch stop dielectric layer 950. For example, the second etch stop dielectric layer 950 includes silicon nitride or a dielectric metal oxide such as aluminum oxide. The thickness of the second etch stop dielectric layer 950 can be in a range from 5 nm to 30 nm, although lesser and greater thicknesses can also be employed.

A second via-level dielectric layer 972 can be deposited over the top surface of the second etch stop dielectric layer 950. The second via-level dielectric layer 972 includes a dielectric material such as undoped silicate glass, a doped silicate glass, or organosilicate glass. The thickness of the second via-level dielectric layer 972 can be in a range from 200 nm to 600 nm, although lesser and greater thicknesses can also be employed.

Second via cavities can be formed through the second via-level dielectric layer 972. For example, a photoresist layer can be applied over the top surface of the second via-level dielectric layer 972, and can be lithographically patterned to form discrete openings that overlie the electrically active nodes within the second device structure 940. An anisotropic etch process can be performed to form the second via cavities underneath the discrete openings in the patterned photoresist layer. The photoresist layer can be removed, for example, by ashing.

At least one conductive material can be subsequently deposited in the second via cavities. For example, a second continuous via-level metallic liner including a metallic nitride material such as TiN, TaN, or WN can be deposited by a conformal deposition process such as a chemical vapor deposition process. The thickness of the second continuous via-level metallic liner can be in a range from 3 nm to 30 nm, although lesser and greater thicknesses can also be employed. A second continuous via-level metallic seed layer can be optionally deposited by a non-conformal deposition process such as a physical vapor deposition process. The second continuous via-level metallic seed layer includes at least one metallic fill material such as Cu, Mo, Ru, Co, Al, another elemental metal, or an intermetallic alloy. The thickness of the second continuous via-level metallic seed layer on vertical or tapered surfaces can be in a range from 3 nm to 30 nm, although lesser and greater thicknesses can also be employed. A second continuous via-level metallic fill layer can be deposited by a conformal deposition process (such as a chemical vapor deposition process) or a superconformal deposition process (such as electroplating or electroless plating) to fill remaining volumes of the second via cavities. The second continuous via-level metallic fill layer can include Cu, CoW, CoWP, Mo, Ru, Co, Al, another elemental metal, or an intermetallic alloy. The material of the second continuous via-level metallic fill layer may be the same as, or different from, the material of the second continuous via-level metallic seed layer.

Excess portions of the at least one conductive material can be removed from above the horizontal plane including the top surface of the second via-level dielectric layer 972 by a planarization process. The planarization process can include a recess etch process and/or a chemical mechanical planarization process. Each remaining portion of the at least one conductive material comprises a conductive via structure, which is herein referred to as a second conductive via structure 92. The second conductive via structure 92 can include a via-level metallic liner 92A and a via-level metallic fill material portion 92B. The via-level metallic liner 92A is a remaining patterned portion of the second continuous via-level metallic liner. The via-level metallic fill material portion 92B is a combination of a remaining patterned portion of the second continuous via-level metallic seed layer and a remaining patterned portion of the second continuous via-level metallic fill layer. Thus, each second conductive via structure 92 includes a combination of a via-level metallic liner 92A and a via-level metallic fill material portion 92B.

Figure 2B:
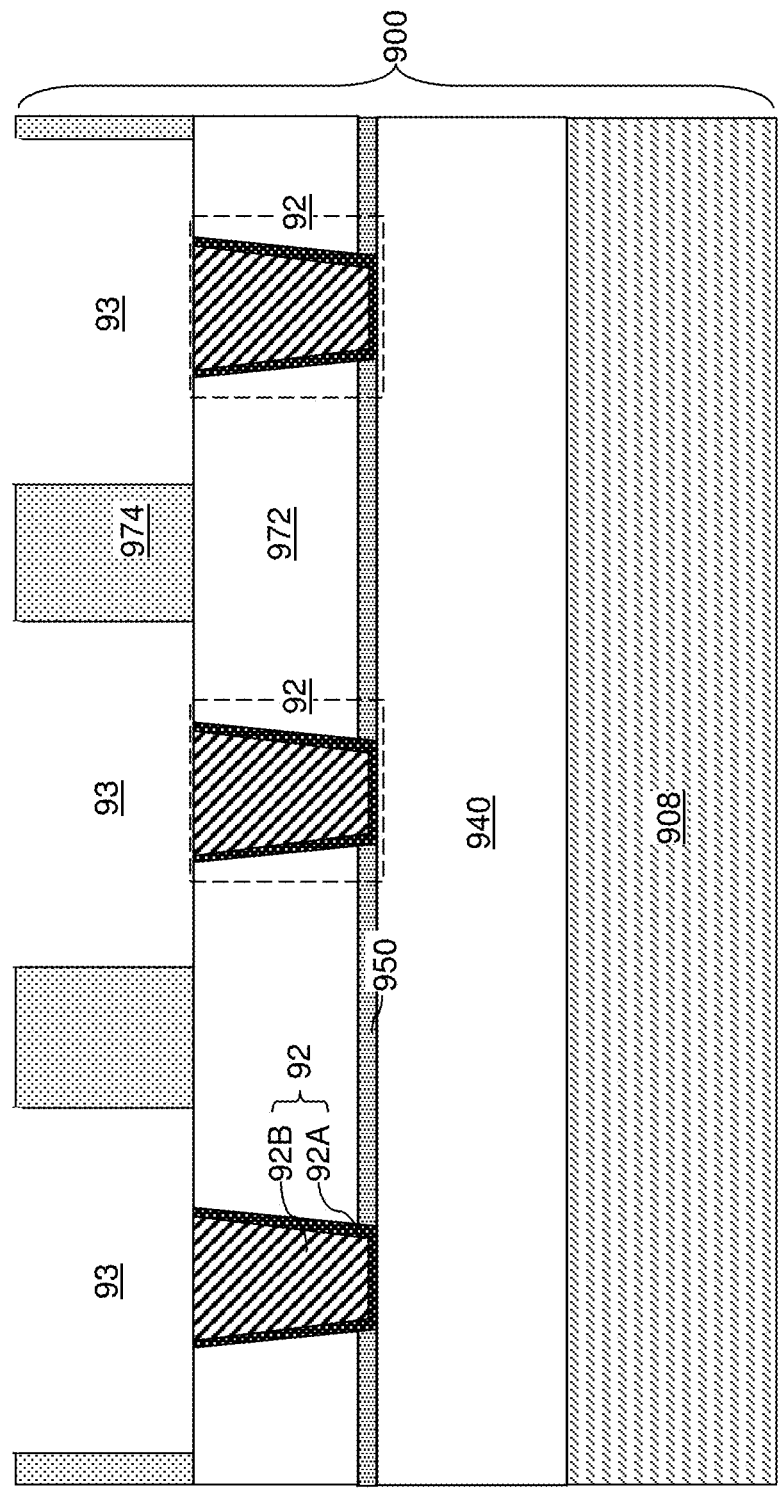
FIG. 2B is a schematic vertical cross-sectional view of the second semiconductor die after formation of a second pad-level dielectric layer and second openings therethrough according to an embodiment of the present disclosure.

Referring to FIG. 2B, a second pad-level dielectric layer 974 can be deposited over the second via-level dielectric layer 972. The second pad-level dielectric layer 974 includes a dielectric material such as undoped silicate glass or a doped silicate glass. The second pad-level dielectric layer 974 can be deposited by a conformal or a non-conformal deposition process. For example, the second pad-level dielectric layer 974 can be formed by a plasma-enhanced chemical vapor deposition process. The thickness of the second pad-level dielectric layer 974 can be in a range from 200 nm to 600 nm, although lesser and greater thicknesses can also be employed.

A photoresist layer (not shown) can be applied over the top surface of the second pad-level dielectric layer 974, and can be lithographically patterned to form pad-shaped openings overlying a respective one of the second conductive via structures 92. An anisotropic etch process can be performed employing the patterned photoresist layer as an etch mask layer. The pattern in the photoresist layer can be transferred through the second pad-level dielectric layer 974 by an anisotropic etch process to form second pad cavities 93. The second via-level dielectric layer 972 can be employed as an etch stop layer for the anisotropic etch process. A top surface of at least one second conductive via structure 92 can be physically exposed at the bottom of each second pad cavity 93. The maximum lateral dimension of each second pad cavity 93 can be in a range from 2 microns to 200 microns, such as from 4 microns to 50 microns, although lesser and greater lateral dimensions can also be employed.

Each second pad cavity 93 can have a horizontal cross-sectional shape of a polygon (such as a rectangle), a rounded polygon, a circle, an ellipse, or any other curvilinear two-dimensional shape having a closed periphery. In one embodiment, the lateral dimensions of the second pad cavities 93 may be different from the lateral dimensions of the first pad cavities 83, and thus, from the lateral dimensions of the first bonding pads 88. In one embodiment, the pattern of the second pad cavities 93 can be formed to include all areas in the pattern of the mirror image of the first bonding pads 88. Alternatively, the pattern of the second pad cavities 93 can be located entirety within the areas of the pattern of the mirror image of the first bonding pads 88.

The sidewalls of the second pad cavities 93 can comprise surfaces of the material of the second pad-level dielectric layer 974. The sidewalls of the second pad cavities 93 can be vertical, or may have a taper angle that is less than 20 degrees relative to the vertical direction. For example, the taper angle may be in a range from 0.1 degree to 5 degrees. A top surface of the second via-level dielectric layer 972 and a top surface of a second conductive via structure 92 can be physically exposed at the bottom of each second pad cavity 93.

Figure 2C:
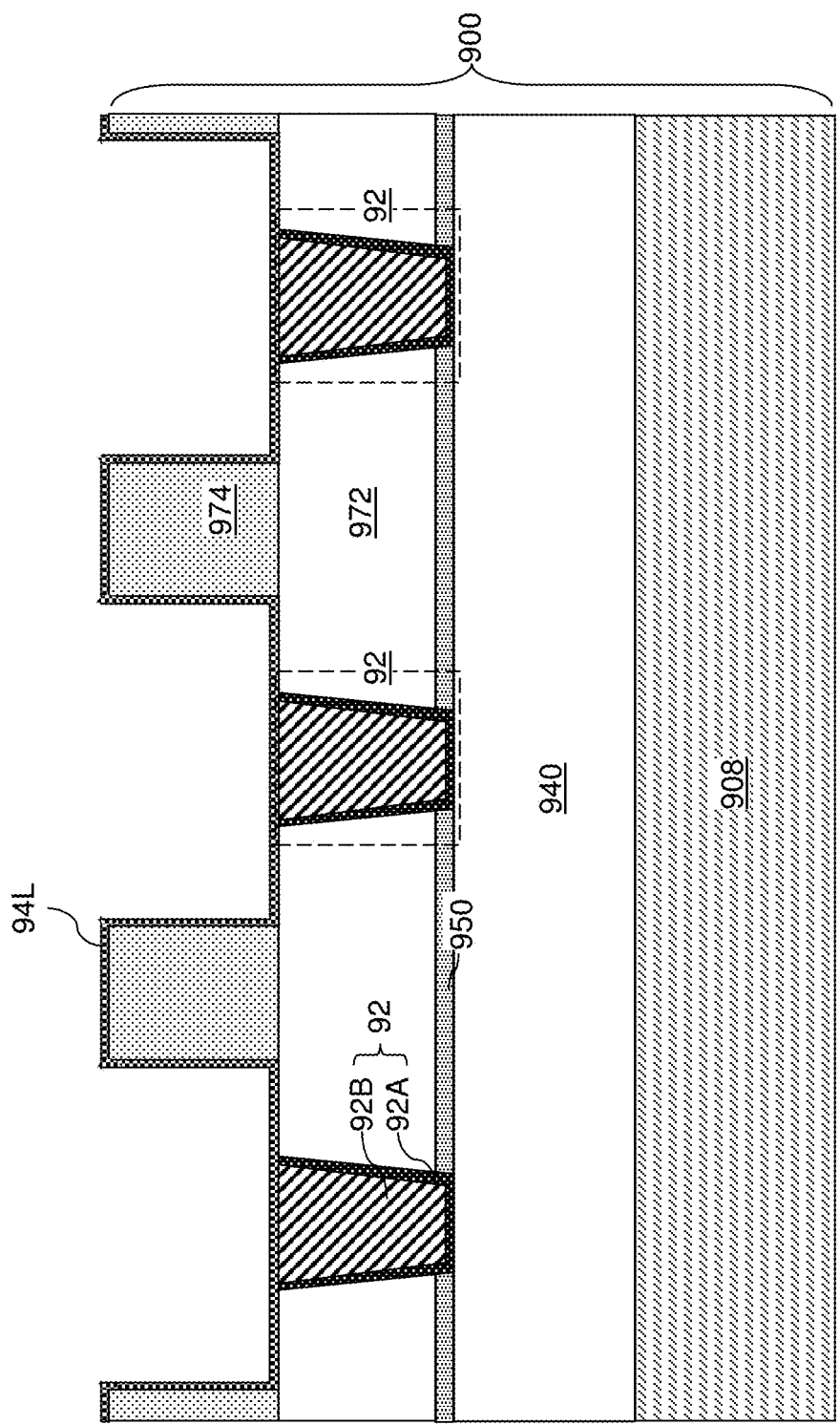
FIG. 2C is a schematic vertical cross-sectional view of the second semiconductor die after formation of a second continuous metallic liner according to an embodiment of the present disclosure.

Referring to FIG. 2C, a second continuous metallic liner 94L including a metallic nitride material such as TiN, TaN, or WN, or a barrier metal such as tantalum can be deposited by a conformal deposition process such as a chemical vapor deposition process. The second continuous metallic liner 94L can be deposited at peripheral regions of the second pad cavities 93 in the second pad-level dielectric layer 974. The thickness of the second continuous metallic liner 94L can be in a range from 3 nm to 30 nm, although lesser and greater thicknesses can also be employed.

Figure 2D:
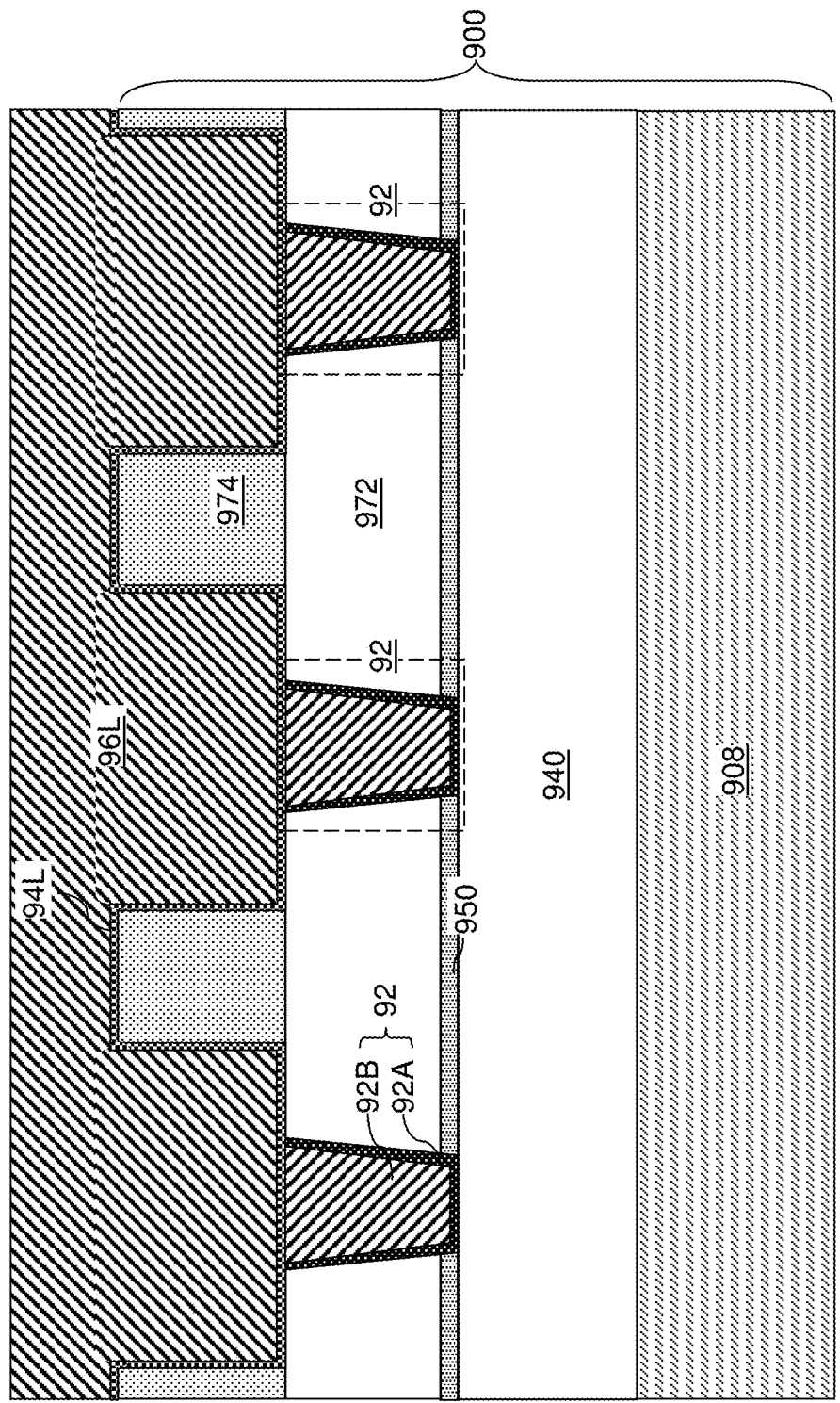
FIG. 2D is a schematic vertical cross-sectional view of the second semiconductor die after formation of a second continuous metallic fill material layer according to an embodiment of the present disclosure.

Referring to FIG. 2D, a second continuous metallic fill material layer 96L can be formed by depositing at least one metallic fill material into remaining volumes of the second pad cavities 93 and over the second continuous metallic liner 94L. The second continuous metallic fill material layer 96L can include a stack that includes, from bottom to top, an optional second continuous metallic seed layer and a second continuous metallic fill layer. In one embodiment, the second continuous metallic fill material layer 96L can comprise a second metallic fill material that includes copper or a copper alloy.

For example, the second continuous metallic seed layer can be optionally deposited by a non-conformal deposition process such as a physical vapor deposition process. The second continuous metallic seed layer includes at least one metallic fill material such as Cu, Mo, Ru, Co, Al, another elemental metal, or an intermetallic alloy. The thickness of the second continuous metallic seed layer on vertical or tapered surfaces can be in a range from 3 nm to 30 nm, although lesser and greater thicknesses can also be employed. The second continuous metallic seed layer can be formed directly on the second continuous metallic liners 94L.

The second continuous metallic fill layer can be deposited on the second continuous metallic seed layer by a conformal deposition process (such as a chemical vapor deposition process) or a superconformal deposition process (such as electroplating or electroless plating) to fill remaining volumes of the second pad cavities 93. In one embodiment, the second continuous metallic fill layer can be formed by electroplating a copper-containing material on the second continuous metallic seed layer. The second continuous metallic fill layer can include Cu, CoW, CoWP, Mo, Ru, Co, Al, another elemental metal, or an intermetallic alloy. The material of the second continuous metallic fill layer may be the same as, or different from, the material of the second continuous metallic seed layer. In one embodiment, the material of the second continuous metallic fill layer may consist essentially of copper or a copper alloy in which the atomic percentage of copper is at least 50%, and/or at least 70%, and/or at least 90%. The composition of the material of the second continuous metallic fill layer may be the same as, or may be different from, the composition of the material of the via-level metallic fill material portions 92B.

Figure 2E:
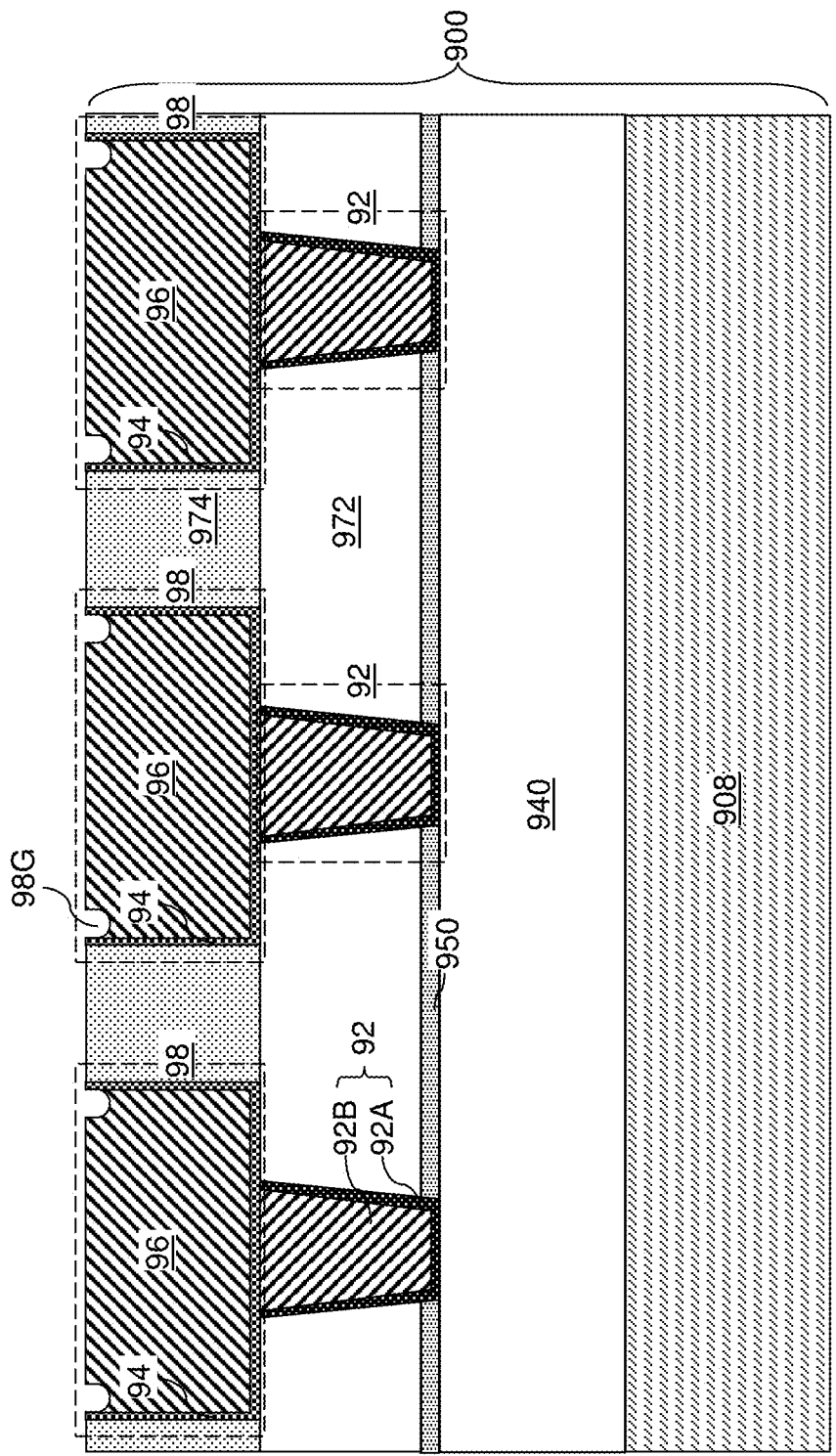
FIG. 2E is a schematic vertical cross-sectional view of the second semiconductor die after formation of second bonding pads according to an embodiment of the present disclosure.

Referring to FIG. 2E, excess portions of the second continuous metallic fill material layer 96L and the second continuous metallic liner 94L can be removed from above the horizontal plane including the top surface (i.e., a horizontal distal surface) of the second pad-level dielectric layer 974 by a planarization process. The planarization process can include a chemical mechanical planarization process. Each remaining portion of the second continuous metallic fill material layer 96L constitutes a second metallic fill material portion 96. Each remaining portion of the second continuous metallic liner 94L constitutes a second metallic liner 94. Each contiguous combination of a second metallic liner 94 and a second metallic fill material portion 96 constitutes a second bonding pad 98. Each second bonding pad 98 can include a second metallic liner 94 and a second metallic fill material portion 96. In one embodiment, each second metallic fill material portion 96 comprises a second metallic fill material that includes copper or a copper alloy.

Generally, a second bonding pad 98 including a second metallic liner 94 and a second metallic fill material portion 96 can be formed within each pad cavity 93 in the second pad-level dielectric layer 974 by removing portions of the second continuous metallic fill material layer 96L and the second continuous metallic liner 94L from above the horizontal plane including the top surface of the second pad-level dielectric layer 974. Remaining contiguous material portions of the second continuous metallic fill material layer 96L and the second continuous metallic liner 94L comprise the second bonding pads 98.

As discussed above, presence of a metallic liner in proximity to a metallic fill material and/or galvanic corrosion during the CMP process may cause peripheral grooves 98G (i.e., edge recesses) at a periphery of a remaining portion of the second metallic fill material 96 adjacent to the second metallic liner 94. In one embodiment, one or more of the grooves 98G may have a configuration of a moat that extends around an entire periphery of a top surface of a respective second metallic fill material portion 96. The depth of each groove may be in a range from 2 nm to 50 nm, such as from 5 nm to 20 nm, and the width of each groove may be in a range from 2 nm to 50 nm, such as from 5 nm to 20 nm, although lesser and greater depths and/or widths can be formed depending on the process characteristics of the chemical mechanical planarization process.

The second semiconductor die 900 comprises a second pad-level dielectric layer 974 embedding second bonding pads 98 and located over a second substrate 908. Each of the second bonding pads 98 is located within a respective pad cavity 93 in the second pad-level dielectric layer 974. Each of the second bonding pads 98 comprises a second metallic liner 94 comprising a second metallic liner material and contacting a sidewall of the respective pad cavity 93, and a second metallic fill material portion 96 embedded in the second metallic liner 94. In one embodiment, a distal surface (i.e., a surface that is distal from the second substrate 908) of the second pad-level dielectric layer 974 is located within a same horizontal plane as a distal surface of the second metallic fill material portions 96, which is the horizontal plane of planarization of the planarization process. In one embodiment, the second metallic fill material portion 96 comprises a second metallic fill material that includes copper or a copper alloy.

Figure 3:
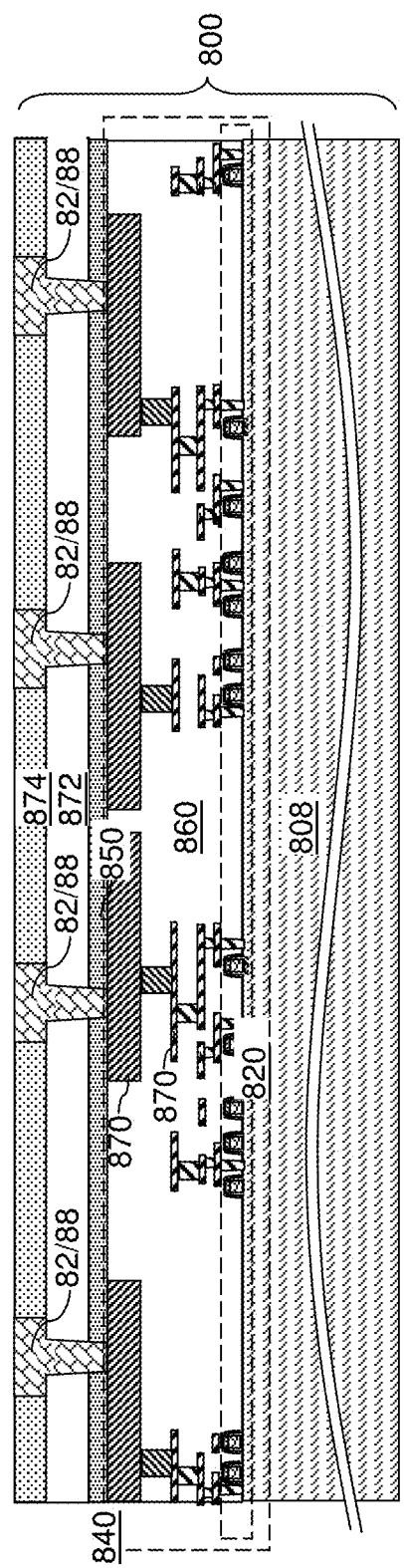
FIG. 3 is another schematic vertical cross-sectional view of the first semiconductor die at the processing steps of FIG. 1I.

Referring to FIG. 3, another schematic vertical cross-sectional view of the first semiconductor die 800 is illustrated at the processing steps of FIG. 1I. Exemplary components of the first device structure 840 are illustrated. For example, the first device structure 840 may include a logic circuit for controlling a three-dimensional memory device that is provided in the second semiconductor die 900. The logic circuit can include field effect transistors 820 in a CMOS configuration, and first metal interconnect structures 870 embedded in first dielectric material layers 860. The first metal interconnect structures 870 provide interconnection between the various nodes of the field effect transistors 820 and between the field effect transistors 820 and the first bonding pads 88.

Figure 4:
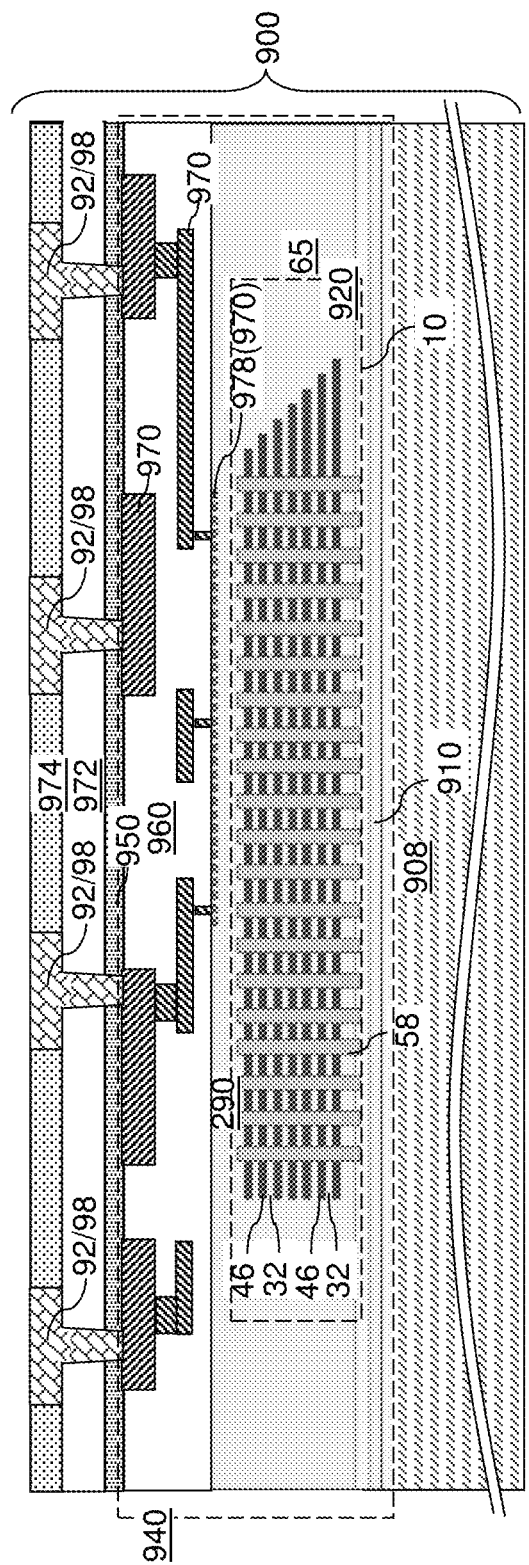
FIG. 4 is another schematic vertical cross-sectional view of the second semiconductor die at the processing steps of FIG. 2E.

Referring to FIG. 4, another schematic vertical cross-sectional view of the second semiconductor die 900 is illustrated at the processing steps of FIG. 2E. Exemplary components of the second device structure 940 are illustrated. For example, the second device structure 940 may include a three-dimensional memory device, such as a three-dimensional NAND memory device. An optional planar dielectric spacer layer 910 and/or an optional semiconductor material layer 10 can be formed over the second substrate 908. A three-dimensional memory array 920 can be formed over the semiconductor material layer 10. The three-dimensional memory array 920 can include a vertically alternating stack of insulating layers 32 and electrically conductive layers (e.g., word lines/control gate electrodes) 46, and memory openings vertically extending through the vertically alternating stack (32, 46). A memory opening fill structure 58 can be formed within each memory opening. Each memory opening fill structure 58 can include a respective memory stack structure, which can include a vertical semiconductor channel and a vertical stack of memory elements. A vertical stack of memory elements may comprise portions of a continuous charge storage layer located at the levels of the electrically conductive layers 46, or may comprise a vertical stack of floating gate structures or discrete charge storage material regions located at the levels of the electrically conductive layers 46. The vertically alternating stack (32, 46) can be patterned to form stepped surfaces. A retro-stepped dielectric material portion 65 can be formed over the stepped surfaces. A contact-level dielectric layer 290 can be formed over the vertically alternating stack (32, 46), and contact via structures (not shown) and bit lines 978 can be subsequently formed. The bit lines 978 are a subset of second metal interconnect structures 970, which are embedded in the second dielectric material layers 960 or in the contact-level dielectric layer 290. The second metal interconnect structures 970 provide electrical connection between the various nodes of the three-dimensional memory array 920 and the second bonding pads 98.

Figure 5:
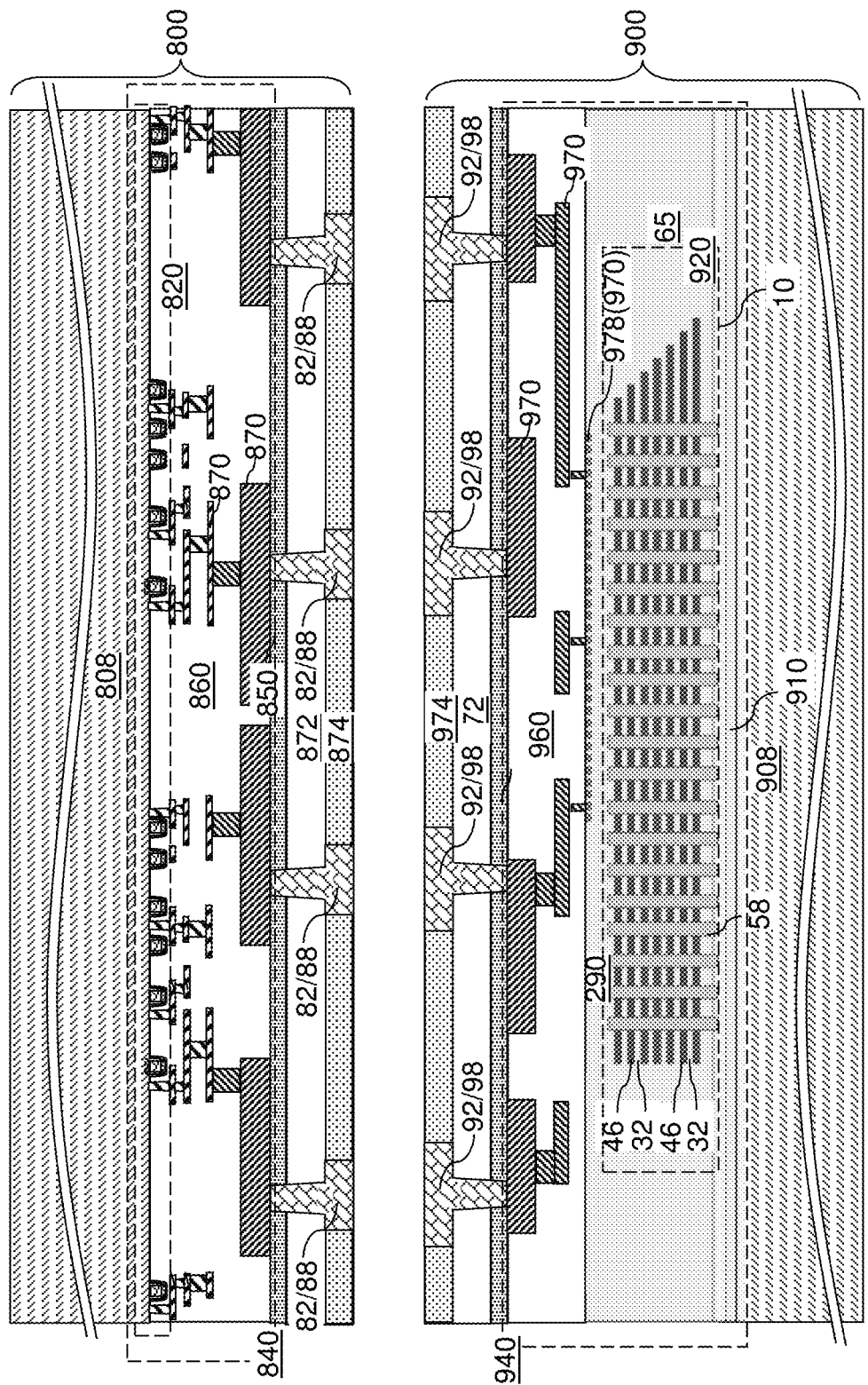
FIG. 5 is a vertical cross-sectional view of an exemplary structure including the first semiconductor die and the second semiconductor die after the second semiconductor die is aligned for bonding with the first semiconductor die according to an embodiment of the present disclosure.

Referring to FIG. 5, the second semiconductor die 900 can be aligned for bonding with the first semiconductor die 800. Specifically, the first semiconductor die 800 and the second semiconductor die 900 can be positioned such that each first bonding pad 88 faces a respective second bonding pad 98. In one embodiment, each first bonding pad 88 can have a smaller area than a respective second bonding pad 98 that faces the first bonding pad 88, and the first semiconductor die 800 can be positioned such that each first bonding pad 88 has a periphery that is located entirely within the area of a periphery of the respective second bonding pad 98 that faces the first bonding pad 88. In this case, the areas of the first bonding pads 88 can be entirely within the areas of the second bonding pads 98.

Figure 6A:
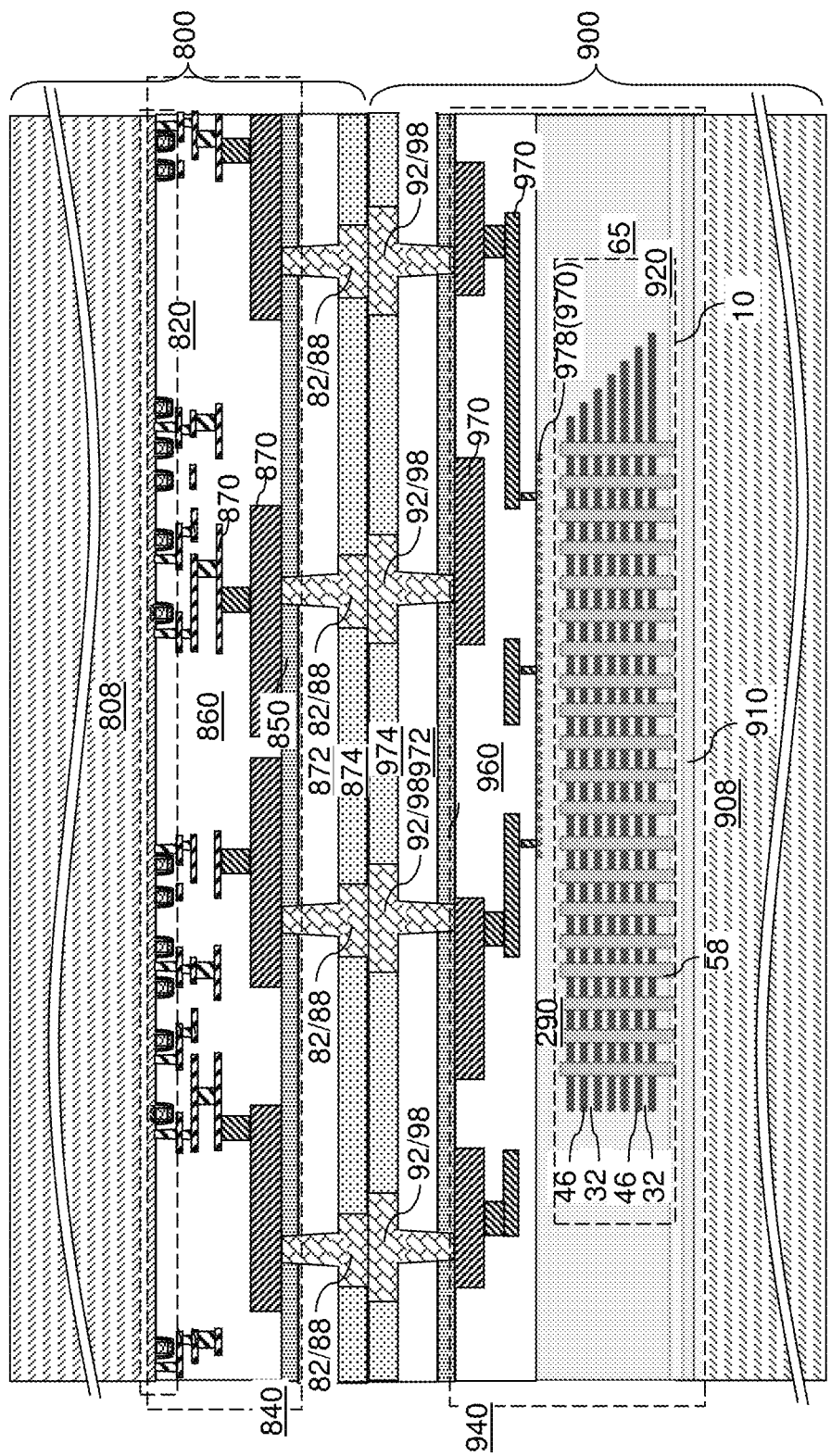
FIG. 6A is a vertical cross-sectional view of the exemplary structure after bonding the second semiconductor die to the first semiconductor die according to an embodiment of the present disclosure.
Figure 6B:
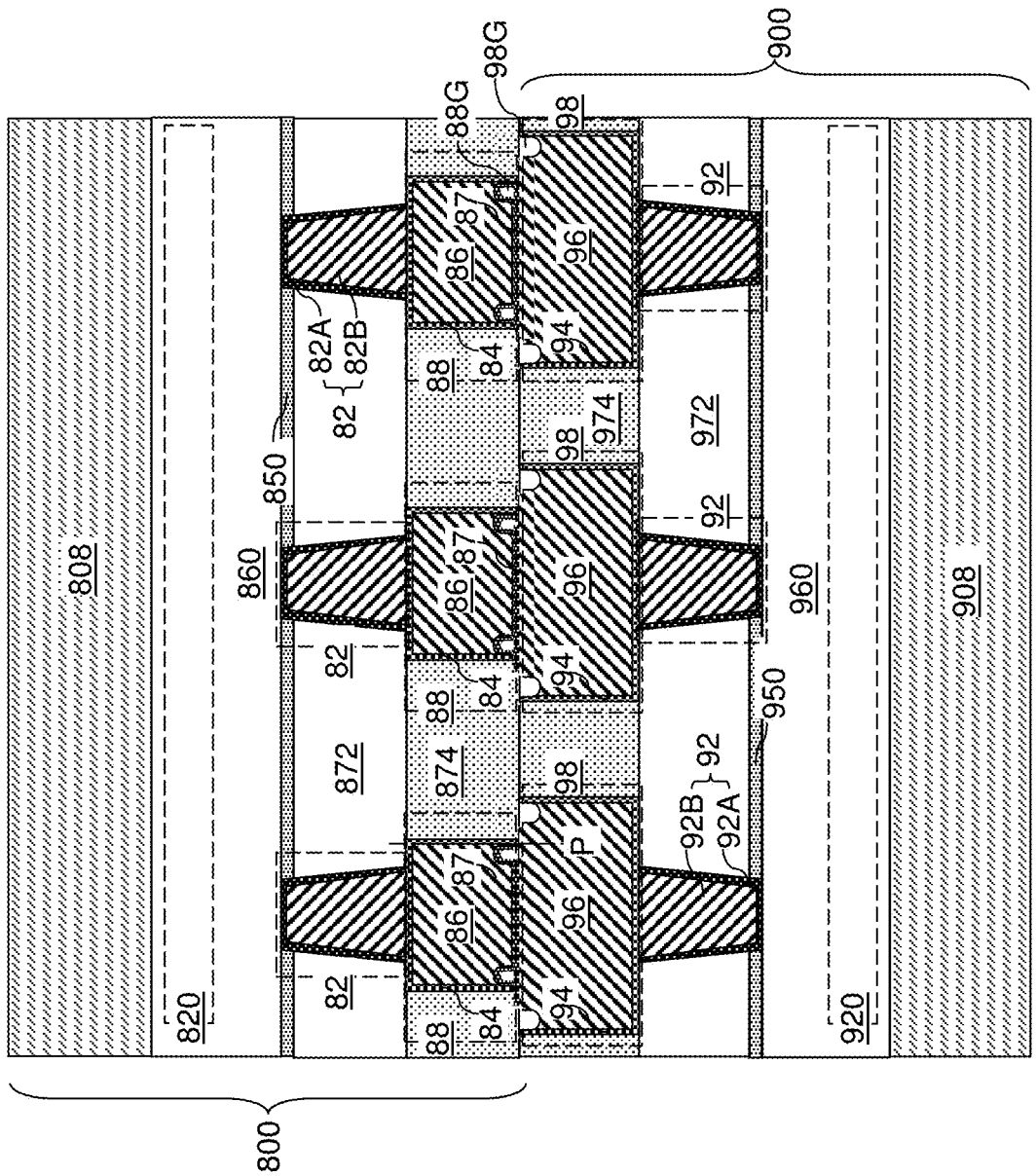
FIG. 6B is another view of the exemplary structure of FIG. 6A in which bonding pads are magnified for clarity.

Referring to FIGS. 6A and 6B, the second semiconductor die 900 is brought into contact with the first semiconductor die 800. In one embodiment, the periphery of each first bonding pad 88 in the first semiconductor die 800 can be located entirely within the periphery of a respective second bonding pad 98 that the first bonding pad 88 contacts. According to an aspect of an embodiment of the present disclosure, the contact surface between each mating pair of a first bonding pad 88 and a second bonding pad 98 can include a planar distal surface of a metallic electromigration barrier layer 87, a generally annular horizontal surface of a first metallic liner 84 having a uniform width between an inner periphery and an outer periphery, and in case the groove 88G in a form of a moat trench is present, a generally annular horizontal surface of the metallic electromigration barrier layer 87.

The second bonding pads 98 can be bonded to the first bonding pads 88 by performing an anneal process at an elevated temperature while the second bonding pads 98 contact the first bonding pads 88. In one embodiment, the material of the metallic electromigration barrier layer 87 can be selected such that metal-to-metal bonding can be formed between the material of the metallic electromigration barrier layers 87 and the second metallic fill material portions 96 during the anneal process. In one embodiment, the metallic electromigration barrier layers 87 can include at least one material selected from TaN, TiN, WN, Ta, Ti, W, Ru, or alloys thereof. The elevated temperature may be in a range from 250 degrees Celsius to 500 degrees Celsius, such as 300 degrees Celsius to 400 degrees Celsius.

The second semiconductor die 900 is bonded to the first semiconductor die 800. The second bonding pads 98 are bonded to a respective one of the first bonding pads 88. Each of the metallic electromigration barrier layers 87 contacts a respective one of the second bonding pads 98. The first metallic fill material portions 86 are vertically spaced from the second bonding pads 98 by the metallic electromigration barrier layers 87.

In one embodiment, each of the second bonding pads 98 comprises a second metallic liner 94 comprising a second metallic liner material, and a second metallic fill material portion 96 contacting the second metallic liner 94 and a respective one of the metallic electromigration barrier layers 87. In one embodiment, the entirety of distal surfaces of a metallic electromigration barrier layer 87 and a first metallic liner 84 within each of the first bonding pads 88 is in contact with a horizontal surface of one of the second metallic fill material portions 96. In one embodiment, a groove 88G overlying a periphery recess region of a second metallic fill material portion 96 may be located entirely outside the contact area between the second metallic fill material portion 96 and a respective one of the first bonding pads 88.

Referring to all drawings and according to various embodiments of the present disclosure, a structure comprising a first semiconductor die 800 is provided, wherein the first semiconductor die 800 comprises: a first pad-level dielectric layer 874 embedding first bonding pads 88 located over a first substrate 808, wherein each of the first bonding pads 88 is located within a respective pad cavity 83 in the first pad-level dielectric layer 874 and comprises: a first metallic liner 84 comprising a first metallic liner material and contacting a sidewall of the respective pad cavity 83; a first metallic fill material portion 86 embedded in the first metallic liner 84; and a metallic electromigration barrier layer 87 contacting the first metallic fill material portion 86 and adjoined to the first metallic liner 84.

A second semiconductor die 900 comprising second bonding pads 98 can be bonded to a respective one of the first bonding pads 88. Each of the second bonding pads 98 comprises a second metallic liner 94 comprising a second metallic liner material; and a second metallic fill material portion 96 contacting the second metallic liner 94 and a respective one of the metallic electromigration barrier layers 87. In one embodiment, the second metallic liner material comprises a metallic nitride material, such as TiN, TaN or WN, and the second metallic fill material portion comprises copper or a copper alloy. In one embodiment, the entirety of distal surfaces of a metallic electromigration barrier layer 87 and a first metallic liner 84 within each of the first bonding pads 88 may be in contact with a horizontal surface of one of the second metallic fill material portions 96.

In one embodiment, one of the first semiconductor die 800 and the second semiconductor die 900 can comprise a memory die. In this case, the memory die may include a three-dimensional memory device including a three-dimensional array of memory elements. Another of the first semiconductor die 800 and the second semiconductor die 900 can comprise a logic die including a control circuit for controlling operation of memory elements within the memory die. For example, the control circuit may include a bit line control circuit, a word line control circuit, a sensing circuit, a power supply circuit, a peripheral circuit, and/or input/output circuit. The backside of the logic die may be thinned, and through-substrate via structures and backside bonding pads can be formed on the logic die to provide electrical connection to external devices.

Embodiments of the present disclosure include a metallic electromigration barrier layer 87 between a first metallic fill material portion 86 within a first bonding pad 88 and a second metallic fill material portion 96 within a second bonding pad 98. The metallic electromigration barrier layer 87 can include a material providing greater electromigration resistance than the materials of the first metallic fill material portion 86 and the second metallic fill material portion 96. For example, the first metallic fill material portion 86 and the second metallic fill material portion 96 can comprise, and/or can consist essentially of, copper or a copper alloy, and the metallic electromigration barrier layer 87 can include a copper diffusion barrier material such as TaN, TiN, WN, Ta, Ti, W, Ru, and/or alloys and/or material stacks of two of more thereof. Thus, the metallic electromigration barrier layer 87 can reduce electromigration between the first bonding pad 88 and the second bonding pad 98.

Without wishing to be bound by a particular theory, it is believed that electromigration stress current flowing in one direction and electron wind flowing in the opposite direction between the contacting copper bonding pads causes copper to diffuse (i.e., migrate) from one pad to the other in the direction of the electron wind. The copper is believed to diffuse laterally to fill the voids in the peripheral grooves 88G and/or 98G in the periphery of the bonding pads. This copper migration is believed to leave voids in one or both pads near the interface between the pads. In other words, the voids from the peripheral grooves effectively migrate toward the interface between the pads in opposite direction from the copper migration. The voids at the interface may create an open circuit or a poor electrical connection between the pads, leading to device failure or poor performance. The metallic electromigration barrier layer 87 is believed to act as a copper diffusion (i.e., migration) barrier, which reduces or prevents copper migration between the copper pads. This reduces or eliminates voids at the interface between the pads and reduces open circuits and improves the electrical connection between the pads. The voids remaining in the peripheral grooves 88G and/or 98G do not significantly affect the device performance.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A structure comprising a first semiconductor die, wherein the first semiconductor die comprises:
    a first pad-level dielectric layer embedding first bonding pads and located over a first substrate, wherein each of the first bonding pads is located within a respective pad cavity in the first pad-level dielectric layer and comprises:
        a first metallic liner comprising a first metallic liner material and contacting a sidewall of the respective pad cavity;
        a first metallic fill material portion embedded in the first metallic liner; and
        a metallic electromigration barrier layer contacting the first metallic fill material portion and adjoined to the first metallic liner, wherein peripheral grooves are located over the metallic electromigration barrier material in a peripheral portion of each of the first bonding pads.

2. The structure of claim 1, wherein a combination of the first metallic liner and the metallic electromigration barrier layer encapsulates the first metallic fill material portion.

3. The structure of claim 1, wherein a distal surface of the first pad-level dielectric layer is located within a same horizontal plane as a distal surface of the metallic electromigration barrier layer.

4. The structure of claim 1, wherein:
    the first metallic liner comprises an inner sidewall;
    a distal region of the inner sidewall contacts the metallic electromigration barrier layer at a first interface; and
    a proximal region of the inner sidewall contacts the first metallic fill material portion at a second interface located within a same two-dimensional plane as the first interface.

5. The structure of claim 1, wherein the second interface is vertically offset from a horizontal plane including a distal horizontal surface of the metallic electromigration barrier layer by a vertical spacing that is greater than a thickness of the metallic electromigration barrier layer.

6. The structure of claim 1, wherein a contact area between the first metallic liner and the metallic electromigration barrier layer has an upper edge located within a horizontal plane including a distal surface of the first pad-level dielectric layer.

7. The structure of claim 6, wherein a peripheral region of the first metallic fill material portion is vertically recessed from the horizontal plane including the distal surface of the first pad-level dielectric layer by a vertical recess distance that is greater than a thickness of the metallic electromigration barrier layer.

8. The structure of claim 1, wherein:
    the first metallic liner material comprises a metallic nitride material;
    the first metallic fill material portion comprises copper or a copper alloy; and
    the metallic electromigration barrier layer comprises at least one material selected from TaN, TiN, WN, Ta, Ti, W, Ru, or alloys thereof.

9. The structure of claim 1, the metallic electromigration barrier layer is laterally spaced from the first pad-level dielectric layer by the first metallic liner.

10. The structure of claim 1, further comprising a second semiconductor die comprising second bonding pads that are bonded to a respective one of the first bonding pads.

11. The structure of claim 10, wherein each of the second bonding pads comprises:
    a second metallic liner comprising a second metallic liner material; and
        a second metallic fill material portion contacting the second metallic liner and a respective one of the metallic electromigration barrier layers.

12. The structure of claim 11, wherein:
    the second metallic liner material comprises a metallic nitride material;
    the second metallic fill material portion comprises copper or a copper alloy; and
    an entirety of distal surfaces of a metallic electromigration barrier layer and a first metallic liner within each of the first bonding pads is in contact with a horizontal surface of one of the second metallic fill material portions.

13. The structure of claim 10, wherein:
    one of the first and second semiconductor dies further comprises a memory die containing a three-dimensional memory device; and
    another one of the first and second semiconductor dies further comprises a control circuit configured to control operation of the three-dimensional memory device.

14. The structure of claim 1, wherein the peripheral grooves are not filled with any solid phase material.

15. The structure of claim 1, wherein:
    the first metallic fill material portion has a top surface containing a first horizontally-extending surface segment in a first horizontal plane;
    the metallic electromigration barrier layer has a top surface containing a second horizontally-extending surface segment in a second horizontal plane located below the first horizontal plane; and
    the peripheral grooves extend downward from the first horizontal plane below the second horizontal plane.

16. The structure of claim 15, wherein the top surface of the metallic electromigration barrier layer within each of the first bonding pads further comprises:
    a first vertically-extending surface segment that defines an outer boundary of the peripheral groove; and
    a second vertically-extending surface segment that is adjoined to an edge of the first horizontally-extending surface segment and defines an inner boundary of the peripheral groove.

17. The structure of claim 1, wherein each of the peripheral grooves have a configuration of a moat that continuously laterally extends around and laterally surrounds a topmost portion of the first metallic fill material portion within each of the first bonding pads.

18. The structure of claim 10, wherein each of the second bonding pads comprises a bottom surface that includes an additional peripheral groove that extends upward from a horizontal plane including a horizontally-extending surface segment of the bottom surface, wherein the additional peripheral groove is not filled with any solid phase material.

19. The structure of claim 18, wherein an inner periphery of the additional peripheral groove laterally encloses and is located entirely outside of an outer periphery of a respective peripheral groove of the first bonding pads for at least one of the second bonding pads.

20. The structure of claim 18, wherein an entirety of a horizontally-extending surface segment of the top surface of each of the first bonding pads contacts the horizontally-extending surface segment of the bottom surface of a respective one of the second bonding pads.

* * * * *